(12) United States Patent
Nishioka et al.

(10) Patent No.: US 8,536,918 B2
(45) Date of Patent: Sep. 17, 2013

(54) FLIP-FLOP CIRCUIT, SCAN TEST CIRCUIT, AND METHOD OF CONTROLLING SCAN TEST CIRCUIT

(75) Inventors: Yuya Nishioka, Kanagawa (JP); Yoshinobu Irie, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 13/433,201

(22) Filed: Mar. 28, 2012

(65) Prior Publication Data

US 2012/0249204 A1    Oct. 4, 2012

(30) Foreign Application Priority Data

Mar. 30, 2011    (JP) ................. 2011-074270

(51) Int. Cl.
*H03K 3/289*    (2006.01)
(52) U.S. Cl.
USPC ......................................................... 327/203
(58) Field of Classification Search
USPC ................. 327/199–203, 208, 210–215, 218
See application file for complete search history.

(56) References Cited

U.S. PATENT DOCUMENTS

| | | | |
|---|---|---|---|
| 6,693,460 B2 * | 2/2004 | Kanba ............................. | 326/93 |
| 6,766,501 B1 * | 7/2004 | Duggirala et al. ............ | 716/124 |
| 2007/0124635 A1 | 5/2007 | Yokota | |

FOREIGN PATENT DOCUMENTS

| JP | 2005-308421 A | 11/2005 |
|---|---|---|
| JP | 2007-127602 A | 5/2007 |

OTHER PUBLICATIONS

"LSSD (Level Sensitive Scan Design)" [Searched on Feb. 20, 2011] the internet http://www.cedcc.psu.edu/ee497i/rassp_43/sid089.htm.
"Chapter Design for Testability" [Searched on Feb. 20, 2011] the internet http://faculty.ksu.edu.sa/musaed/CEN491Doc/Scan-Path.ppt.

* cited by examiner

*Primary Examiner* — Lincoln Donovan
*Assistant Examiner* — Sibin Chen
(74) *Attorney, Agent, or Firm* — McGinn IP Law Group, PLLC

(57) ABSTRACT

Provided is a flip-flop circuit which a small-sized test circuit with hold free and can perform test in an actual operating frequency. A Pos-type F/F includes a master latch (Low level latch) that selectively receives data or scan test data in synchronization with a rising edge of a clock signal, and a slave latch (High level latch) that receives the data from the master latch. In a scan shift operation, the master latch captures scan data signal input SIN in a Low period of a scan shift clock signal SCLK1 and outputs the data to the slave latch. The slave latch captures the output of the master latch in a High period of a scan shift clock signal SCLK2 having a different edge position from the SCLK1 and outputs the data to Q.

9 Claims, 33 Drawing Sheets

FLIP-FLOP CIRCUIT, SCAN TEST CIRCUIT, AND METHOD OF CONTROLLING SCAN TEST CIRCUIT

CROSS-REFERENCE TO RELATED APPLICATIONS

This application is based upon and claims the benefit of priority from Japanese patent application No. 2011-074270, filed on Mar. 30, 2011, the disclosure of which is incorporated herein in its entirety by reference.

BACKGROUND

The present invention relates to a scan flip-flop circuit used when a scan test of a semiconductor integrated circuit is conducted, a test circuit using the scan flip-flop circuit, and a method of controlling the test circuit, and specifically, to a technique using a scan flip-flop circuit including two latch circuits of a master latch and a slave latch.

A scan test using an LSSD (Level Sensitive Scan Design) latch has already been known. A technique related to the scan test using the LSSD latch is disclosed in multiple literatures, including for example, "LSSD (Level Sensitive Scan Design)" [searched on Feb. 20, 2011] the Internet <http://www.cedcc.psu.edu/ee497i/rassp_43/s1d089.htm>, "Chapter Design For Testability" [searched on Feb. 20, 2011] the Internet <http://faculty.ksu.edu.sa/musaed/CEN491Doc/Scan-Path.ppt>, and FIG. 6 of Japanese Unexamined Patent Application Publication No. 2005-308421.

FIG. 18 is a view showing a representative LSSD latch circuit disclosed in these cited literatures. As shown in FIG. 18, an LSSD circuit 800 includes a latch circuit 302 which is a Low level latch, and a latch circuit 303 which is a Low level latch.

The latch circuit 302 receives a data input D, a clock signal C, a scan shift data input I, and a scan clock signal A, and outputs data to a data output L1. The latch circuit 303 receives output data from the latch circuit 302 and a scan clock signal B, and outputs data to a data output L2.

The Low level latch (low-level latch) here means a circuit that captures data in a Low level of the clock signal and holds the data in a High level, and the High level latch (high-level latch) means a circuit that captures data in a High level of the clock signal and holds the data in a Low level.

In recent years, semiconductor integrated circuits such as an LSI (Large Scale Integration) include flip-flops (F/Fs) in accordance with a high-speed operation and an increase in size from the point of easiness of timing design. Typically, the F/F is formed of two stages of latch circuits of a master latch and a slave latch. Accordingly, in order to form an F/F of LSSD type using the LSSD latch shown in FIG. 18, a master latch is added to the input side of the LSSD latch.

Hereinafter, a related scan test using the F/F of LSSD type will be described in detail. In the specification, the term "normal operation" means a user circuit operation, the term "capture operation" means an operation to capture test data in a scan flip using a user circuit, and the term "scan shift operation" means the shift operation of test data from one flip-flop to the next flip-flop in the scan test operation.

FIG. 19 is a circuit view showing a Pos-type scan flip-flop circuit (hereinafter referred to as a Pos-type F/F), which is a related LSSD type. The Pos-type F/F here means an F/F that operates in synchronization with the rising edge of the clock signal.

As shown in FIG. 19, a Pos-type F/F 300 includes a latch circuit 301 which is a Low level latch, a latch circuit 302 which is a High level latch, and a latch circuit 303 which is a High level latch.

The latch circuit 301 receives a data input signal D by a data input and a normal clock signal C by a latch signal, and outputs a data signal Y. The latch circuit 302 receives a scan shift dedicated clock signal (scan shift clock signal) SA and the normal clock signal C by a latch signal, and receives a scan shift data input SI and the data signal Y which is the output from the latch circuit 301 by a data input. The latch circuit 303 receives a scan shift clock signal SB by a latch signal and a data output Q which is the output from the latch circuit 302 by a data input, and outputs a scan out signal SO.

FIG. 20 is a circuit view showing an example of detail of the latch circuit 302 of the Pos-type F/F 300 shown in FIG. 19. As shown in FIG. 20, the latch circuit 302 includes a latch circuit 310 which is a High level latch, a selector circuit 311, and an OR circuit 312.

The selector circuit 311 receives the scan shift data input SI and the data signal Y. The selector circuit 311 outputs the scan shift data input SI when the scan shift clock signal SA is in a High level, and outputs the data signal Y when the SA is in a Low level. The OR circuit 312 receives the scan shift clock signal SA and the normal clock signal C, and outputs the resulting signal to a latch signal of the latch circuit 310. The latch circuit 310 receives the output from the selector circuit 311 by a data input and receives the output from the OR circuit 312 by the latch signal, and outputs a data output Q.

FIG. 21 is a timing chart showing an operation of a transition delay test using the Pos-type F/F 300 shown in FIG. 19. FIG. 21 shows operations of the normal clock signal C, the scan shift clock signals SA and SB, the data input signal D, the scan shift data input SI, the output data signal Y of the latch circuit 301, the output data Q of the latch circuit 302, and the output scan out SO of the latch circuit 303. Further, a scan shift cycle SS1 indicates the last three cycle periods of the scan shift operation, a scan capture cycle SC indicates the scan capture operation period, and a scan shift cycle SS2 indicates the first scan shift operation period after the scan capture operation.

First, the scan shift operation will be described using clock cycles C1 and C2. In a period of the scan shift cycle SS1, the normal clock signal C becomes Low level. At time T100, since the scan shift clock signal SA is raised, the latch circuit 302 is in a through state and captures test data D1 from the scan in terminal SI, and outputs the test data D1 to the output data terminal Q. At time T101, since the scan shift clock signal SA is fallen, the latch circuit 302 holds the test data D1 from the scan in terminal SI.

At time T102, since the scan shift clock signal SB is raised, the latch circuit 303 is in the through state and captures the test data D1 from the output data terminal Q, and outputs the test data D1 to the scan out terminal SO. At time T103, since the scan shift clock signal SB is fallen, the latch circuit 303 holds the test data D1 from the output data terminal Q.

Next, the capture operation will be described using clock cycles C4 and C5. At time T110, since the normal clock signal C is raised, the latch circuit 301 holds capture data capA (also shown as cA or A in the drawings) from the data input terminal D and outputs the capture data capA to the data signal Y. Further, at time T110, the latch circuit 302 captures capA which is the output signal data signal Y from the latch circuit 301.

At time T111, since the normal clock signal C is fallen, the latch circuit 301 captures the capture data capB from the data input terminal D. Further, at time T111, the latch circuit 302 holds capA which is the output signal data Y from the latch circuit 301.

At time T112, since the normal clock signal C is raised, the latch circuit 301 holds capture data capB (also shown as cB or B in the drawings) from the data input terminal D. Further, at time T112, the latch circuit 302 captures capB which is the output signal data signal Y from the latch circuit 301.

At time T113, since the normal clock signal C is fallen, the latch circuit 302 holds capB which is the output signal data signal Y from the latch circuit 301.

FIG. 22 is a circuit view showing a Neg-type scan flip-flop circuit (hereinafter referred to as a Neg-type F/F), which is a related LSSD type. The Neg-type F/F here means an F/F that operates in synchronization with a falling edge of the clock signal.

As shown in FIG. 22, a Neg-type F/F 400 includes a latch circuit 401 which is a High level latch, a latch circuit 402 which is a Low level latch, and a latch circuit 403 which is a Low level latch.

The latch circuit 401 receives a data input signal D by a data input, and receives a normal clock signal CB by a latch signal. The latch circuit 402 receives a scan shift clock signal SAB and the normal clock signal CB by a latch signal, and receives a scan shift data input SI and a data signal Y which is the output from the latch circuit 401 by a data input. The latch circuit 403 receives a scan shift clock signal SBB by a latch signal, receives a data output Q which is the output from the latch circuit 402 by a data input, and outputs the signal to a scan out signal SO.

FIG. 23 is a circuit view showing one example of detail of the latch circuit 402 of the Neg-type F/F 400 shown in FIG. 22.

As shown in FIG. 23, the latch circuit 402 includes a latch circuit 410 which is a Low level latch, a selector circuit 411, and an AND circuit 412.

The selector circuit 411 receives the scan shift data input SI and the data signal Y. The selector circuit 411 outputs the scan shift data input SI when the scan shift clock signal SAB is in the Low level, and outputs the data signal Y when the SAB is in the High level. The AND circuit 412 receives the scan shift clock signal SAB and the normal clock signal CB, and outputs the resulting signal to a gate signal of the latch circuit 410. The latch circuit 410 receives the output from the selector circuit 411 by a data input, receives the output from the AND circuit 312 by a gate terminal, and outputs the signal to a data output Q.

FIG. 24 is a timing chart showing an operation of the transition delay test using the Neg-type F/F 400 shown in FIG. 22. FIG. 24 shows operations of the normal clock signal CB, scan shift clock signals SAB and SBB, the data input signal D, the scan shift data input SI, the output data signal Y of the latch circuit 401, the output data Q of the latch circuit 402, and the output scan out SO of the latch circuit 403. Further, a scan shift cycle SS1 indicates the last three cycle periods of the scan shift operation, a scan capture cycle SC indicates the scan capture operation period, and a scan shift cycle SS2 indicates the first scan shift operation period after the scan capture operation.

First, the scan shift operation will be described using the clock cycles C1 and C2. As shown in FIG. 24, at time T200, since the scan shift clock signal SAB is fallen, the latch circuit 402 is in a through state to capture the test data D1 from the scan in terminal SI, and outputs the test data D1 to the output data terminal Q. At time T201, since the scan shift clock signal SAB is raised, the latch circuit 402 holds the test data D1 from the scan in terminal SI.

At time T202, since the scan shift clock signal SBB is fallen, the latch circuit 403 is in the through state to capture the test data D1 from the output data terminal Q, and outputs the test data D1 to the scan out terminal SO.

At time T203, since the scan shift clock signal SBB is raised, the latch circuit 403 holds the test data D1 from the output data terminal Q.

Next, the capture operation will be described using clock cycles C4 and C5. At time T210, since the normal clock signal CB is fallen, the latch circuit 401 holds capture data capA from the data input terminal D, and outputs the capture data capA to the data signal Y. Further, at time T210, the latch circuit 402 captures capA which is the output signal data signal Y from the latch circuit 401.

At time T211, since the normal clock signal CB is raised, the latch circuit 401 captures capture data capB from the data input terminal D. Further, at time T211, the latch circuit 402 holds capA which is the output signal data Y from the latch circuit 401.

At time T212, since the normal clock signal CB is fallen, the latch circuit 401 holds the capture data capB from the data input terminal D. Further, at time T212, the latch circuit 402 captures capB which is the output signal data signal Y from the latch circuit 401.

At time T213, since the normal clock signal CB is raised, the latch circuit 402 holds capB which is the output signal data signal Y from the latch circuit 401.

In the meantime, some circuits including a DDR memory interface or a processor are intended to double throughput without increasing an existing clock frequency. Semiconductor integrated circuits including these circuits have a circuit configuration in which data is transmitted and received at each of the rising edge and the falling edge of clock signals. In short, such a semiconductor integrated circuit includes the Pos-type F/F and the Neg-type F/F connected each other. The problem in the scan F/F using such a typical LSSD latch is that it is impossible to perform a transition delay failure test between the Pos-type F/F and the Neg-type F/F when these F/Fs are connected each other.

Next, a scan test circuit configuration in a circuit in which the Neg-type F/F and the Pos-type F/F are connected will be described. FIG. 25 is a view showing a scan test circuit configuration in a circuit in which the Neg-type F/F and the Pas-type F/F are connected.

As shown in FIG. 25, a scan test circuit 510 includes a Pos-type F/F 300, a Neg-type F/F 400, user combination circuits 1002 and 1003, and a previous scan flip-flop circuit 1010.

The Neg-type F/F 400 receives the output signal from the previous scan flip-flop circuit 1010 by a scan in terminal SI, a scan shift clock signal SA by a scan shift clock terminal SAB, a scan shift clock signal SB by a scan shift clock terminal SBB, the output from the user combination circuit 1003 by a data signal terminal D, and a normal clock signal C by a normal clock terminal CB. A data output terminal Q is input to the user combination circuit 1002.

The Pos-type F/F 300 connects an SO which is the output signal from the Neg-type F/F 400 to a scan shift terminal SI, receives the output from the user combination circuit 1002 by a data input terminal D, the scan shift clock signals SA and SB by scan shift clock terminals SA and SB, respectively, and the normal clock signal C by a normal clock terminal C.

FIG. 26 is a timing chart showing a scan shift operation in a related scan test circuit shown in FIG. 25. FIG. 26 shows changes of signal levels of a Neg-type F/F signal SIG1 and a Pos-type F/F signal SIG2 in the periods of the scan shift cycle SS and the scan capture cycle SC.

As shown in FIG. 26, the Neg-type F/F signal SIG1 indicates signals input to the normal clock terminal CB, the scan shift clock terminals SAB and SBB, the scan in terminal SI and the data input terminal D which are input terminals of Neg-type F/F, and signals output from the data output terminal Q and the scan out terminal SO which are output terminals of Neg-type F/F.

The Pos-type F/F signal SIG2 indicates signals input to the normal clock terminal C, the scan shift clock terminals SA and SB, the scan in terminal SI, and the data input terminal D which are input terminals of Pos-type F/F, and signals output from the data output terminal Q and the scan out terminal SO which are output terminals of Pos-type F/F.

The scan shift cycle SS includes clock cycles C1, C2, and C3. Further, the scan capture cycle SC includes clock cycles C4 and C5.

At time T300, the scan out SO of Neg-type F/F outputs the test data D1 from the scan in SI of Neg-type F/F. Further, at time T300, the Pos-type F/F captures the test data D1 from the Neg-type F/F.

At time T301, the Pos-type F/F outputs the test data D1 from the Neg-type F/F.

As described above, when the transition delay failure test between circuits in which the Neg-type F/F and the Pos-type F/F are connected is executed, the test data D1 from the scan in SI of Neg-type F/F output at time 1300 in one clock cycle period C1 is output from the scan out of Pos-type F/F at time T301, and thus the correct shift operation cannot be performed.

Specifically, it is originally required to supply, to the Neg-type F/F, the scan shift clock signals SAB and SBB shown in FIG. 24 having the opposite polarity from that of the signals shown in FIG. 26, instead of the scan shift clock signals SAB and SBB shown in FIG. 26. However, as shown in FIG. 25, when the Neg-type F/F and the Pos-type F/F are connected, only one kind of scan dedicated clock signals SA, SB or SAB, SBB can be input, which raises the problem that the shift operation is not correctly performed. Accordingly, in the scan test circuit using the related F/F of LSSD type, an inverter for inverting scan dedicated clock signals are provided when the Neg-type F/F and the Pos-type F/F are connected.

The use of the F/F of related LSSD type eliminates the need to secure the hold time (hold free). However, in recent years, the wiring width and the wiring pitches of the semiconductor integrated circuit including LSI have been decreased due to the high-speed operation and miniaturization of the process. Thus, it is necessary to perform the delay failure test in the actual operating frequency in order to screen wiring which may be disconnected or failure in wiring through incomplete VIA.

The delay failure test in the actual operating frequency is performed by the clock signal CB (or clock signal C) shown in FIG. 26. However, as described above, the clock signal CB of Neg-type F/F needs to have the shape shown in FIG. 24. If the clock signal CB shown in FIG. 26 is input, the circuit does not properly operate. Accordingly, also for the clock signal CB, an inverter needs to be provided to invert the clock signal CB.

However, the delay failure in the actual operating frequency needs to be performed under the actual operation circumstances, and it is impossible to perform the test while keeping the inverter provided since the inverter is not used for the original actual operation. Specifically, when the scan test circuit is formed using the F/F of LSSD type, it is absolutely necessary to provide an inverter to invert the scan dedicated clock signal and the clock signal when the Neg-type F/F and the Pos-type F/F are connected. However, when the inverter is provided, it is impossible to perform the delay test in the actual operating frequency.

In a scan test of a recent semiconductor integrated circuit, a flip-flop of MUXSCAN type has been widely used that operates by the same clock signal in both of the Neg-type F/F and the Pos-type F/F (see FIG. 2 and the like in Japanese Unexamined Patent Application Publication No. 2007-127602). Further, while the F/F of LSSD type normally includes three latches, the F/F of MUXSCAN type can be formed of two latches. Thus, the F/F of MUXSCAN type has an advantage over the F/F of LSSD type in that the gate size can be reduced.

Next, the F/F of MUXSCAN type will be described. FIG. 27 is a circuit view showing an F/F of Pos-type which is an F/F of MUXSCAN type. As shown in FIG. 27, a MUXSCAN 500 includes a master latch 510 which is a Low level latch, a slave latch 511 which is a High level latch, and a selector 520.

The selector 520 receives a data signal and scan shift data. Then, the selector 520 selects a scan shift data input (scan in) SIN when a scan mode control signal SMC is in the High level, and selects the data input signal D in the normal operation when the SMC is in the Low level.

A data input terminal of the master latch 510 is connected to the output of the selector 520, and a latch signal terminal of the master latch 510 receives a clock signal CLK.

A data input terminal of the slave latch 511 is connected to a data output terminal of the master latch 510, and a latch signal terminal of the slave latch 511 receives the clock signal CLK.

FIG. 28 is a circuit view showing an F/F of Neg-type which is an F/F of MUXSCAN type. As shown in FIG. 28, a MUXSCAN 600 includes a master latch 610 which is a High level latch, a slave latch 611 which is a Low level latch, and a selector 620.

The selector 620 receives a data signal and scan shift data. Then, the selector 620 selects the scan shift data input SIN when a scan mode control signal SMC is in the High level, and selects the data input signal D in the normal operation when the SMC is in the Low level.

A data input terminal of the master latch 610 is connected to the output of the selector 620, and a latch signal terminal of the master latch 610 receives a clock signal CLKB.

A data input terminal of the slave latch 611 is connected to a data output terminal of the master latch 610, and a latch signal terminal of the slave latch 611 receives the clock signal CLKB.

Next, an operation of the F/F of MUXSCAN type will be described. FIG. 29 is a timing chart showing an operation of a scan F/F of MUXSCAN type (Pos type). FIG. 29 shows changes in the levels of the clock signal CLK, the scan mode control signal SMC, the data input signal D, the scan shift data input SIN, the input M of the master latch, the input S of the slave latch, and the data output Q in the scan F/F of MUXSCAN type (Pos type) in the periods of a scan shift cycle SS (clock signals C1, C2, and C3) and a scan capture cycle SC (clock signals C4 and C5).

In the scan shift cycle SS, the master latch 510 captures data from the scan shift data input SIN according to a falling of the clock signal CLK, the slave latch 511 captures a data signal according to a falling of the clock signal CLK, and outputs the data signal to the data output Q at the next rising. In the scan capture cycle SC, the data from the data input is captured at the rising timing of the clock signal CLK, and the data is output to the data output Q.

FIG. 30 is a timing chart showing an operation of a scan F/F of MUXSCAN type (Neg type). FIG. 30 shows changes in the levels of the clock signal CLK, the scan mode control signal SMC, the data input signal D, the scan shift data input SIN, the input M of the master latch, the input S of the slave latch, and the data output Q in the scan F/F of MUXSCAN type (Neg type) in the periods of a scan shift cycle SS (clock signals C1, C2, and C3) and a scan capture cycle SC (clock signals C4 and C5).

In the scan shift cycle SS, the master latch 610 captures data from the scan shift data input SIN according to a falling of the clock signal CLK, the slave latch 611 captures a data signal according to a rising of the clock signal CLK, and outputs the data signal to the data output Q at the next rising. In the scan capture cycle SC, the data from the data input is captured according to a falling of the clock signal CLK, and the data is output to the data output Q.

FIG. 31 is a view showing a circuit configuration in which F/Fs of MUXSCAN type (Pos type) are connected. The data from the previous scan flip-flop circuit 1010 is connected to a scan shift data input terminal SIN of a MUXSCAN 500a in the left side of FIG. 31, and data output Q is connected to a scan shift data input terminal SIN of a subsequent MUXSCAN 500b. The output from the combination circuit 1000 is connected to the data input terminal.

FIG. 32 is a timing chart showing an operation of the F/Fs of MUXSCAN type (Pos type) shown in FIG. 31. The MUXSCAN 500a and the MUXSCAN 500b receive the same clock signal. Since the data output terminal Q of the MUXSCAN 500a is directly connected to the scan shift data input terminal SIN of the MUXSCAN 500b, the delay is substantially 0. Since the timing for capturing data by the slave latch 511 in the MUXSCAN 500a and the timing for holding data by the master latch 510 in the MUXSCAN 500b are in the same edge, this causes occurrence of hold violations and leaking of data. Accordingly, it is required to provide a delay element for securing the hold time in a scan shift data line between the F/F of MUXSCAN type (Pos type) and the F/F of MUXSCAN type (Pos type).

FIG. 33 is a view showing one example of forming a scan chain by F/Fs of MUXSCAN type. When the Pos-type F/F and the Neg-type F/F are mixed, the Pos-type F/Fs 500 and the Neg-type F/Fs 600 are connected. Accordingly, as shown in FIG. 33, a delay element 1 is required between each of the Pos-type F/Fs 500 and the Neg-type F/Fs 600.

As described above, in recent years, flip-flops of MUXSCAN type have been widely employed as a technique for performing a scan test in the semiconductor integrated circuit in order to perform the delay failure test in the actual operating frequency. However, the shift line of the scan is connected in the shift register structure, and the input clock signal of the previous flip-flop and the input clock signal of the subsequent flip-flop are the same in the shift register structure. Thus, hold time is not sufficiently secured. This causes insufficiency of hold time due to manufacturing variations or clock skew at the time of design. Accordingly, as shown in FIG. 33, it is required to provide the delay elements to secure the hold time.

In summary, since the delay element (buffer) to secure the hold time is required to be provided in all areas between flip-flops operating in the same edge in MUXSCAN, the process to arrange buffers for performing hold compensation is required in a later process. Further, since the buffers are arranged in the later process, it is impossible to provide buffers in target positions when there is no vacant space, which causes deterioration of wiring. Accordingly, the use of the F/F of MUXSCAN type may cause an increase in TAT (Turn Around Time) in the layout process, deterioration of wiring, and an increase in the gate size. In particular, the LSI has recently been increasing in size, which causes a great increase in the gate size and deterioration of wiring.

SUMMARY

As described above, desired in the technique of the scan test in the semiconductor integrated circuit is a scan test technique which is a small-sized test circuit with hold free and can perform test in the actual operating frequency.

A first exemplary aspect of the present invention is a flip-flop circuit including: a master latch that selectively receives a data signal or a scan data signal; and a slave latch that receives an output signal of the master latch, in which one of the master latch and the slave latch is a high-level latch, and another one of the master latch and the slave latch is a low-level latch, the high-level latch being a circuit that captures a signal in a high level of a clock signal and holds data of the signal in a low level, the low-level latch being a circuit that captures a signal in a low level of a clock signal and holds data of the signal in a high level, in a scan shift operation, the master latch captures the scan data signal in response to a first clock signal and the slave latch captures the output data signal in response to a second clock signal different from the first clock signal, and in another operation, the master latch captures the data signal in response to a normal clock signal and the slave latch captures the output data signal in response to the normal clock signal.

A second exemplary aspect of the present invention is a scan test circuit including: a Positive-type scan flip-flop (Pos-type F/F) that operates in synchronization with a rising edge of a clock signal and a Negative-type scan flip-flop (Neg-type F/F) that operates in synchronization with a falling edge of the clock signal, in which each of the Pos-type F/F and the Neg-type F/F comprises a master latch and a slave latch, one of the master latch and the slave latch being a high-level latch, and the other one of the master latch and the slave latch being a low-level latch, the high-level latch being a circuit that captures a signal in a high level of a clock signal and holds data of the signal in a low level, the low-level latch being a circuit that captures a signal in a low level of a clock signal and holds data of the signal in a high level, the Pas-type F/F and the Neg-type F/F form a scan chain in a mixed manner, the Pos-type F/F captures scan data signal in response to a first clock signal to output the scan data signal in response to a second clock signal different from the first clock signal in a scan shift operation, and the Neg-type F/F captures the scan data signal in response to the second clock signal to output the scan data signal in response to the first clock signal in the scan shift operation.

A third exemplary aspect of the present invention is a method of controlling a scan test circuit that includes a Positive-type scan flip-flop (Pos-type F/F) and a Negative-type scan flip-flop (Neg-type F/F), each of the Pos-type F/F and the Neg-type F/F including a master latch and a slave latch, one of the master latch and the slave latch being a high-level latch and the other one of the master latch and the slave latch being a low-level latch, the Pos-type F/F operating in synchronization with a rising edge of a clock signal and the Neg-type F/F operating in synchronization with a falling edge of the clock signal forming a scan chain in a mixed manner, the high-level latch being a circuit that captures a signal in a high level of a clock signal and holds data of the signal in a low level, the low-level latch being a circuit that captures a signal in a low level of a clock signal and holds data of the signal in a high level, the method of controlling the scan test circuit including: inputting a first clock signal and a second clock signal different from the first clock signal to the master latch and the salve latch of Pos-type F/F, respectively, in a scan shift operation, and inputting the second clock signal and the first clock signal to the master latch and the slave latch of Neg-type F/F, respectively, in the scan shift operation.

In the present invention, two kinds of scan shift clock signals that control the operation of the latches in the shift operation are input to the scan flip-flop including two latches. Accordingly, even when the scan flip-flop that operates in synchronization with the rising edge of lock and the scan flip-flop that operates in synchronization with the falling edge are connected, the shift operation can be accurately performed. Further, since both of the scan flip-flops can be controlled with the same scan shift clock signal, the delay test in the actual operating frequency can be performed.

According to the present invention, it is possible to provide a scan-flip-flop which is a small-sized test circuit with hold free and can perform test in an actual operating frequency, a scan test circuit using the same, and a method of controlling the scan test circuit.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Hereinafter, specific embodiments of the present invention will be described in detail with reference to the drawings. In these embodiments, the present invention is applied to a scan F/F including two latches of a master latch and a slave latch, the scan F/F being capable of securing hold time, and a scan test circuit using the scan F/F.

In these embodiments, two kinds of scan shift clock signals are input to the scan F/F, thereby making operation clock edges of the slave latch and the master latch different between F/Fs operating in the same edge. In this way, a scan F/F which does not require hold compensation (hold free) can be provided.

First Embodiment of the Present Invention

Figure 1:
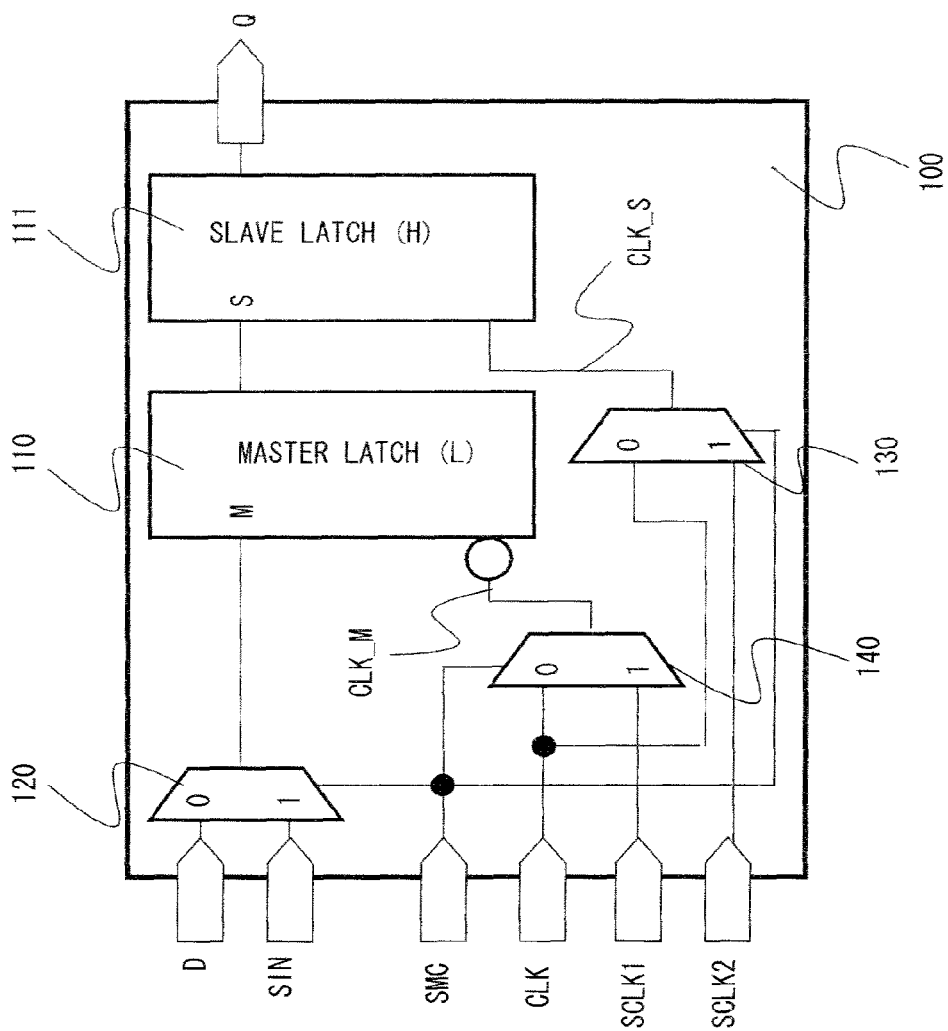
FIG. 1 is a circuit view showing a Pos-type F/F 100 according to a first embodiment of the present invention.

FIG. 1 is a circuit view showing a Pos-type F/F 100 according to a first embodiment of the present invention. As shown in FIG. 1, the Pos-type F/F 100 includes a master latch 110 which is a Low level latch, a slave latch 111 which is a High level latch, and selectors 120, 130, and 140.

The selector 120 receives a data signal and scan shift data (a scan shift data signal). The selector 120 selects a scan shift data input SIN when a scan mode control signal SMC is in a High level, and selects a data input D in a normal operation when the SMC is in a Low level.

The selector 140 receives a scan shift clock signal SCLK1 and a normal clock signal CLK. The selector 140 selects the scan shift clock signal SCLK1 when the scan mode control signal SMC is in the High level, and selects the normal clock signal CLK when the SMC is in the Low level. The selector 140 then outputs the selected signal as a clock signal CLK_M.

The selector 130 receives a scan shift clock signal SCLK2 and the normal clock signal CLK. The selector 130 selects the scan shift clock signal SCLK2 when the scan mode control signal SMC is in the High level, and selects the normal clock signal CLK when the SMC is in the Low level. The selector 130 then outputs the selected signal as a clock signal CLK_S.

A data input terminal of the master latch 110 receives the output from the selector 120, and a latch signal terminal of the master latch 110 receives the output from the selector 140 (clock signal CLK_M).

A data input terminal of the slave latch 111 receives the data output of the master latch 110, and a latch signal terminal of the slave latch 111 receives the output from the selector 130 (clock signal CLK_S).

Figure 2:
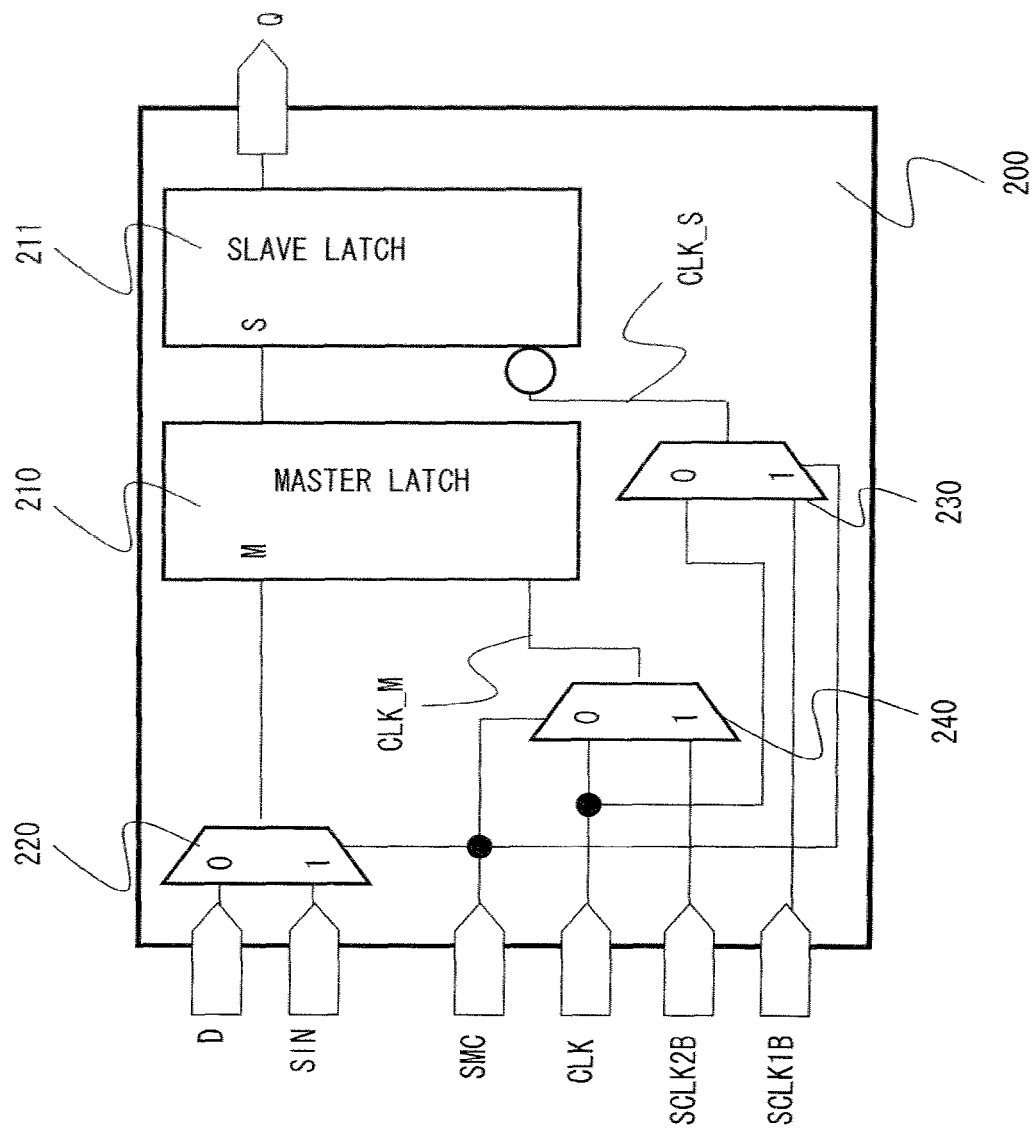
FIG. 2 is a circuit view showing a Neg-type F/F 200 according to the first embodiment of the present invention.

FIG. 2 is a circuit view showing a Neg-type F/F 200 according to the first embodiment of the present invention. As shown in FIG. 2, the Neg-type F/F 200 includes a master latch 210 which is a High level latch, a slave latch 211 which is a Low level latch, and selectors 220, 230, and 240.

The selector 220 receives a data signal and scan shift data (scan shift data signal). The selector 220 selects a scan shift data input SIN when a scan mode control signal SMC is in the High level, and selects a data input D in a normal operation when the SMC is in the Low level.

The selector 240 receives a scan shift clock signal SCLK2B and a normal clock signal CLK. The selector 240 selects the scan shift clock signal SCLK2B when the scan mode control signal SMC is in the High level, and selects the normal clock signal CLK when the SMC is in the Low level. The selector 240 then outputs the selected signal as a clock signal CLK_M.

The selector 230 receives a scan shift clock signal SCLK1B and the normal clock signal CLK. The selector 230 selects the scan shift clock signal SCLK1B when the scan mode control signal SMC is in the High level, and selects the normal clock signal CLK when the SMC is in the Low level. The selector 230 then outputs the selected signal as a clock signal CLK_S.

A data input terminal of the master latch 210 receives the output from the selector 220, and a latch signal terminal of the master latch 210 receives the output from the selector 240 (clock signal CLK_M).

A data input terminal of the slave latch 211 receives data output from the master latch 210, and a latch signal terminal of the slave latch 211 receives the output from the selector 230 (clock signal CLK_S).

Figure 3:
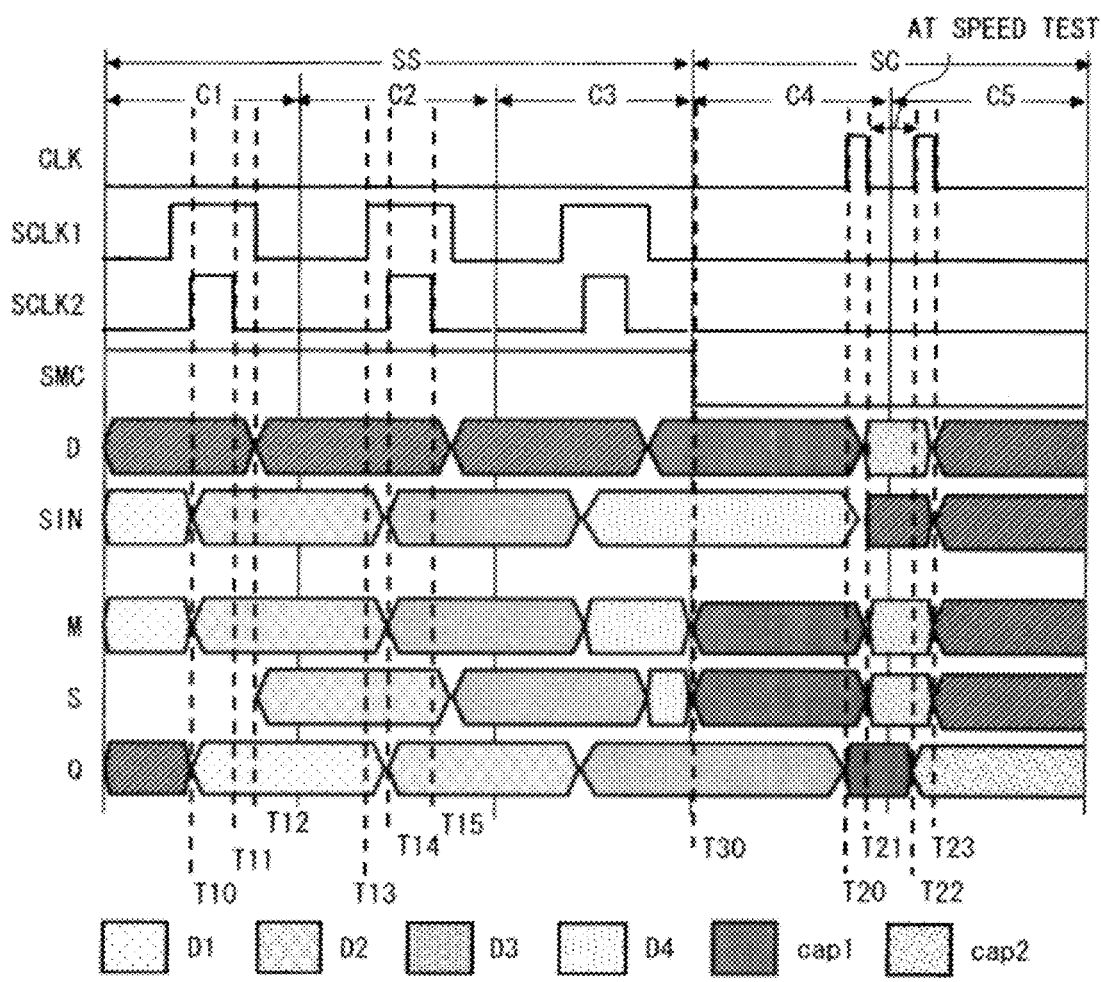
FIG. 3 is a flowchart showing an operation of the Pos-type F/F 100 according to the first embodiment of the present invention in a waveform type 1.
Figure 4:
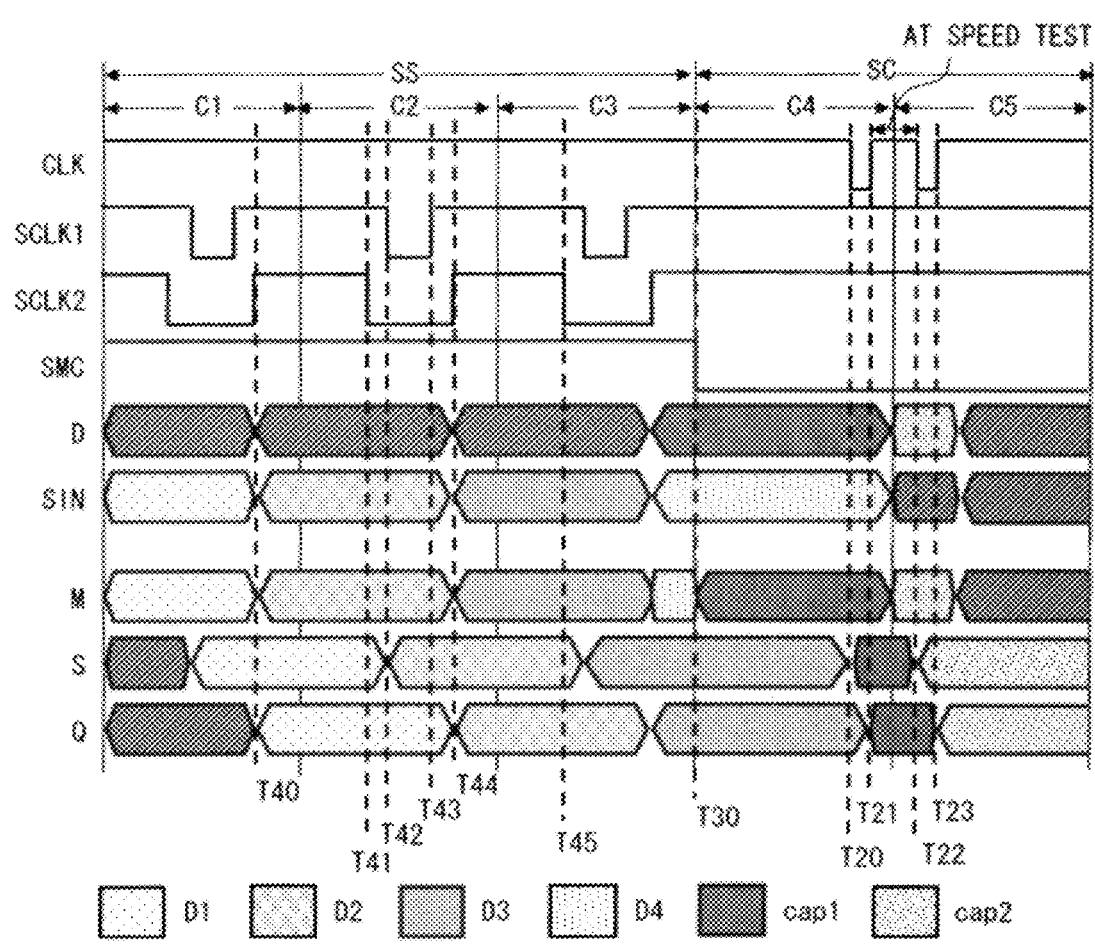
FIG. 4 is a flowchart showing an operation of the Pos-type F/F 100 according to the first embodiment of the present invention in a waveform type 2.
Figure 5:
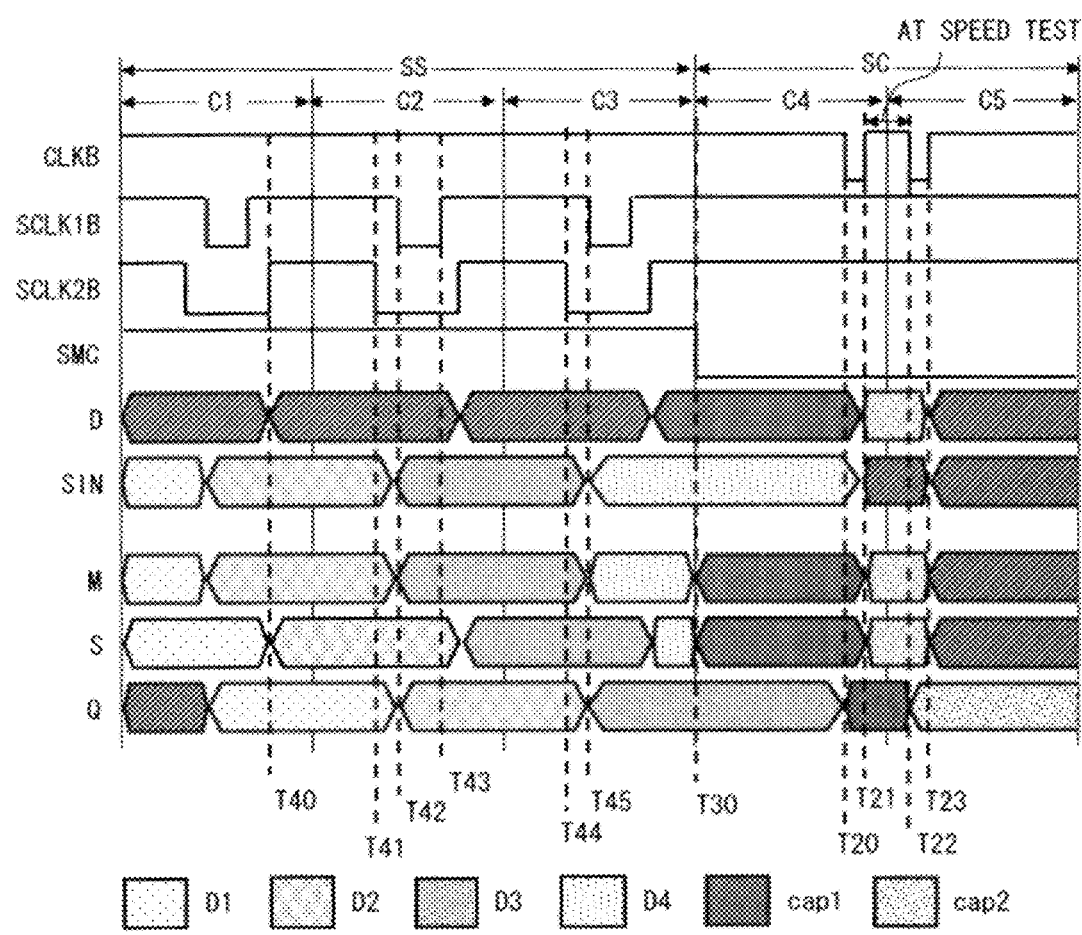
FIG. 5 is a flowchart showing an operation of the Neg-type F/F 200 according to the first embodiment of the present invention in the waveform type 2.
Figure 6:
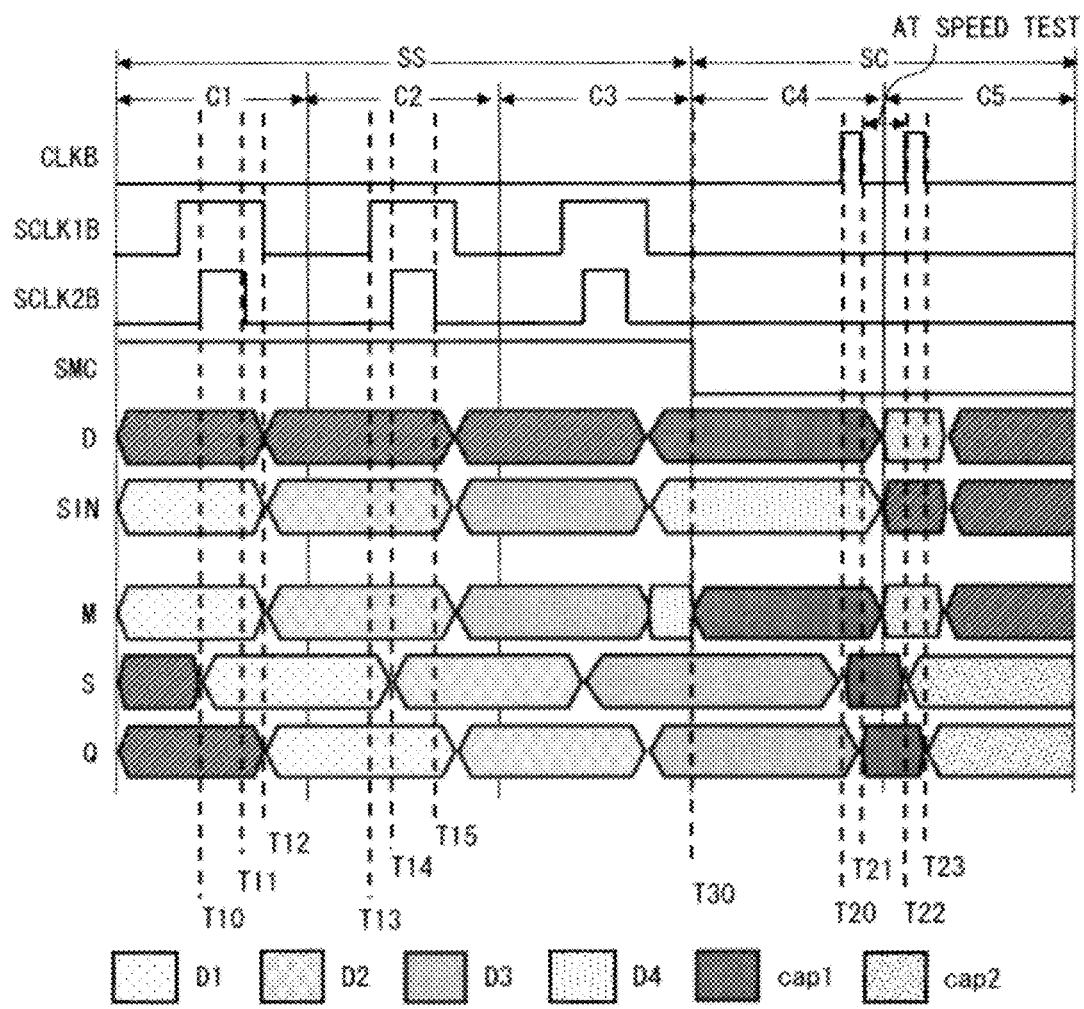
FIG. 6 is a flowchart showing an operation of the Neg-type F/F 200 according to the first embodiment of the present invention in the waveform type 1.

FIGS. 3 and 4 are flowcharts each showing an operation of the Pos-type F/F 100. In FIGS. 3 and 4, waveform patterns of the scan clock signals SCLK1 and SCLK2 are different. In this specification, for the sake of convenience, the waveform illustrated in FIG. 3 is denoted by a waveform type 1, and the waveform illustrated in FIG. 4 is denoted by a waveform type 2. Further, FIGS. 5 and 6 are flowcharts each showing an operation of the Neg-type F/F 200. FIGS. 5 and 6 show operations when the waveform type 2 and the waveform type 1 are input, respectively.

As shown in FIGS. 3 to 6, the waveform types 1 and 2 have such waveform patterns that, the scan shift clock signal SCLK2 (SCLK2B) as a second clock signal is in the low level when the scan shift clock signal SCLK1 (SCLK1B) as a first clock signal is in the low level; and the scan shift clock signal SCLK1 (SCLK1B) is in the high level when the scan shift clock signal SCLK2 (SCLK2B) is in the high level.

In the waveform type 1, as shown in FIGS. 3 and 6, the rising edges of the scan shift clock signal SCLK1 (SCLK1B) are located before the rising edges of the scan shift clock signal SCLK2 (SCLK2B), and the falling edges of the scan shift clock signal SCLK1 (SCLK1B) are located after the falling edges of the scan shift clock signal SCLK2 (SCLK2B).

Further, in the waveform type 2, as shown in FIGS. 4 and 5, the falling edges of the scan shift clock signal SCLK2 (SCLK2B) are located before the falling edges of the scan shift clock signal SCLK1 (SCLK1B), and the rising edges of the scan shift clock signal SCLK2 (SCLK2B) are located after the rising edges of the scan shift clock signal SCLK1 (SCLK1B).

FIGS. 3 and 4 show the normal clock signal CLK, the scan clock signals SCLK1 and SCLK2, the scan mode control signal SMC, an output signal D from a user circuit, the scan shift data input SIN from the previous scan flip-flop, an input M of the master latch, an input S of the slave latch, and a data output Q in the Pos-type F/F 100.

Further, FIGS. 5 and 6 show the normal clock signal CLKB, the scan clock signals SCLK1B and SCLK2B, the scan mode control signal SMC, an output signal (data input) D from a user circuit, the scan shift data input SIN from the previous scan flip-flop, an input M of the master latch, an input S of the slave latch, and a data output Q in the Neg-type F/F 200.

Furthermore, FIGS. 3 to 6 show the changes in the levels of these signals in the periods of a scan shift cycle SS and a scan capture cycle SC.

It is assumed that the scan shift cycle SS includes clock cycles C1, C2, and C3, and the scan capture cycle SC includes C4 and C5. In this case, the scan shift cycle SS indicates the last three cycle periods of the scan shift operation, and the scan capture cycle SC indicates the scan capture operation period.

First, the scan shift operation will be described using the clock cycles C1 and C2. The scan mode control signal SMC becomes High level during the period of the scan shift cycle SS, becomes Low level at time T30, and keeps Low level during the period of the scan capture cycle SC.

In FIGS. 3 and 4, at time T12 (T42), since the scan clock signal SCLK1 is fallen, the master latch 110 of Pos-type F/F captures test data (data input) D2 from the scan data input terminal SIN from the previous F/F.

At time T14 (T44), since the shift clock signal SCLK2 is raised, the slave latch 111 of Pos-type F/F captures test data D2 from the master latch 110 of Pos-type F/F, and outputs the test data D2 to the data output terminal Q.

At time T15 (T45), since the scan clock signal SCLK2 is fallen, the slave latch 111 of Pos-type F/F holds the test data D2 from the master latch 110 of Pos-type F/F.

In FIG. 5, at time T40, since the scan clock signal SCLK2B is raised, the master latch 210 of Neg-type F/F captures the test data D2 from the scan shift data input terminal SIN.

In FIG. 6, at time T10, since the scan clock signal SCLK2B is raised, the master latch 210 of Neg-type F/F captures the test data D1 from the scan shift data input terminal SIN.

At time T41 (T11), since the scan clock signal SCLK2B is fallen, the master latch 210 of Neg-type F/F holds the test data D2 (D1) from the scan shift data input terminal SIN.

At time T42 (T12), since the scan clock signal SCLK1B is fallen, the slave latch 211 of Neg-type F/F captures the test data D1 from the master latch 210 of Neg-type F/F and outputs the test data D2 (D1) to the data output terminal Q.

At time T43 (T13), since the scan clock signal SCLK1B is raised, the slave latch 211 of Neg-type F/F holds the test data D2 (D1) from the master latch 210 of Neg-type F/F.

Next, the capture operation will be described using clock cycles C4 and C5. After time T30, since the scan mode control signal SMC is in the Low level, the normal clock signal is supplied to the master latch and the slave latch in any scan F/F.

In FIG. 6, at time T20, since the normal clock signal CLKB is raised, the master latch 210 of Neg-type F/F captures capture data cap1 from the user circuit. Further, in FIG. 3, at time T20, since the normal clock signal CLK is raised, the master latch 110 of Pos-type F/F holds capture data cap1 from the user circuit.

In FIG. 6, at time T21, since the normal clock signal CLKB is fallen, the slave latch 211 of Neg-type F/F captures output data cap1 from the master latch 210 of Neg-type F/F. Further, at time T21, since the normal clock signal CLKB is fallen, the master latch 210 of Neg-type F/F holds capture data cap1 from the user circuit.

Further, in FIG. 3, at time T21, since the normal clock signal CLK is fallen, the master latch 110 of Pos-type F/F captures the capture data cap1 from the user circuit. Further, at time T21, since the normal clock signal CLK is fallen, the slave latch 111 of Pos-type F/F holds the capture data cap1 from the master latch of Pos-type F/F.

Next, in FIG. 6, at time T22, since the normal clock signal CLKB is raised, the master latch 210 of Neg-type F/F captures capture data cap2 from the user circuit.

Further, in FIG. 3, at time T22, since the normal clock signal CLK is raised, the master latch 110 of Pos-type F/F holds the capture data cap2 from the user circuit. Further, at time T22, since the normal clock signal CLK is raised, the slave latch 111 of Pos-type F/F captures the capture data cap2 from the master latch 110 of Pos-type F/F.

In FIG. 6, at time T23, since the normal clock signal CLKB is fallen, the slave latch 211 of Neg-type F/F captures the output data cap2 from the master latch 210 of Neg-type F/F. Further, at time T23, since the normal clock signal CLKB is fallen, the master latch 210 of Neg-type F/F holds the capture data cap2 from the user circuit.

Further, in FIG. 3, at time T23, since the normal clock signal CLK is fallen, the slave latch 111 of Pos-type F/F holds the capture data cap2 from the master latch of Pos-type F/F.
<*1 START>

In FIG. 5, at time T20, since the normal clock signal CLKB is fallen, the master latch 210 of Neg-type F/F holds capture data cap1 from the user circuit. Further, at time T20, since the normal clock signal CLKB is fallen, the slave latch 211 of Neg-type F/F captures output data cap1 from the master latch 210 of Neg-type F/F.

Further, in FIG. 4, at time T20, since the normal clock signal CLK is fallen, the master latch 110 of Pos-type F/F captures the capture data cap1 from the user circuit. Further, at time T20, since the normal clock signal CLK is fallen, the slave latch 111 of Pos-type F/F holds the capture data cap1 from the master latch of Pos-type F/F.

In FIG. 5, at time T21, since the normal clock signal CLKB is raised, the master latch 210 of Neg-type F/F captures capture data cap2 from the user circuit. Further, in FIG. 4, at time T21, since the normal clock signal CLK is raised, the master latch 110 of Pos-type F/F holds capture data cap1 from the user circuit.

In FIG. 5, at time T22, since the normal clock signal CLKB is fallen, the master latch 210 of Neg-type F/F holds the capture data cap2 from the user circuit. Further, at time T22, since the normal clock signal CLKB is fallen, the slave latch 211 of Neg-type F/F captures the output data cap2 from the master latch 210 of Neg-type F/F.

Further, in FIG. 4, at time T22, since the normal clock signal CLK is fallen, the slave latch 111 of Pos-type F/F holds the capture data cap1 from the master latch of Pos-type F/F.

Next, in FIG. 5, at time T23, since the normal clock signal CLKB is raised, the master latch 210 of Neg-type F/F captures capture data cap2 from the user circuit.

Further, in FIG. 4, at time T23, since the normal clock signal CLK is raised, the master latch 110 of Pos-type F/F holds the capture data cap2 from the user circuit. Further, at time T23, since the normal clock signal CLK is raised, the slave latch 111 of Pos-type F/F captures the capture data cap2 from the master latch 110 of Pos-type F/F.
<*1 END>

Figure 7:
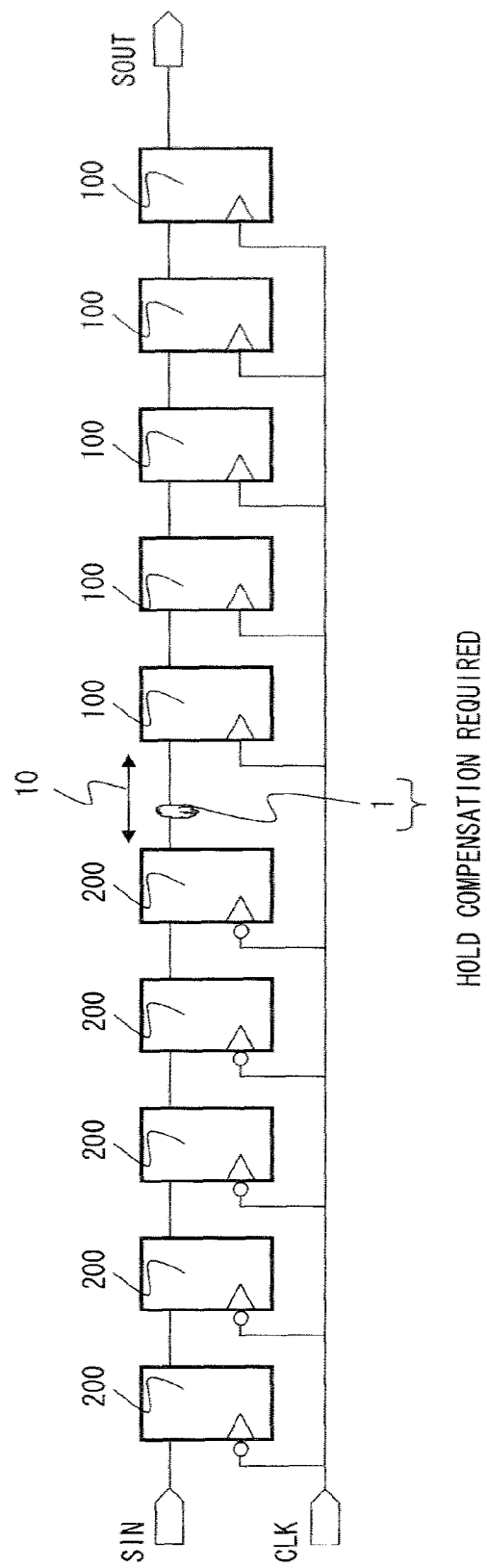
FIG. 7 is a view showing a scan chain using the Pos-type F/Fs 100 and the Neg-type F/Fs 200 according to the first embodiment of the present invention.

Next, the scan test circuit using the Pos-type F/F 100 and the Neg-type F/F 200 according to the first embodiment will be described. FIG. 7 is a view showing a scan chain using the Pos-type F/F 100 and the Neg-type F/F 200. In the LSI, the Pos-type F/F 100 and the Neg-type F/F 200 are used in a mixed manner in order to achieve the function and the operation. Accordingly, the Pos-type F/F 100 and the Neg-type F/F 200 are mixed in the scan chain using the Pos-type F/Fs 100 and the Neg-type F/Fs 200. In this case, normally, the Pos-type F/Fs 100 are connected each other, and the Neg-type F/Fs 200 are connected each other to form the scan chain. This is because the connection of the Pos-type F/F 100 and the Neg-type F/F 200 causes operation at double speed of the normal clock signal. However, even when the Pos-type F/Fs 100 are connected each other or the Neg-type F/Fs 200 are connected each other, a pass 10 that connects the Pos-type F/F 100 and the Neg-type F/F 200 is generated at least in one position.

Figure 33:
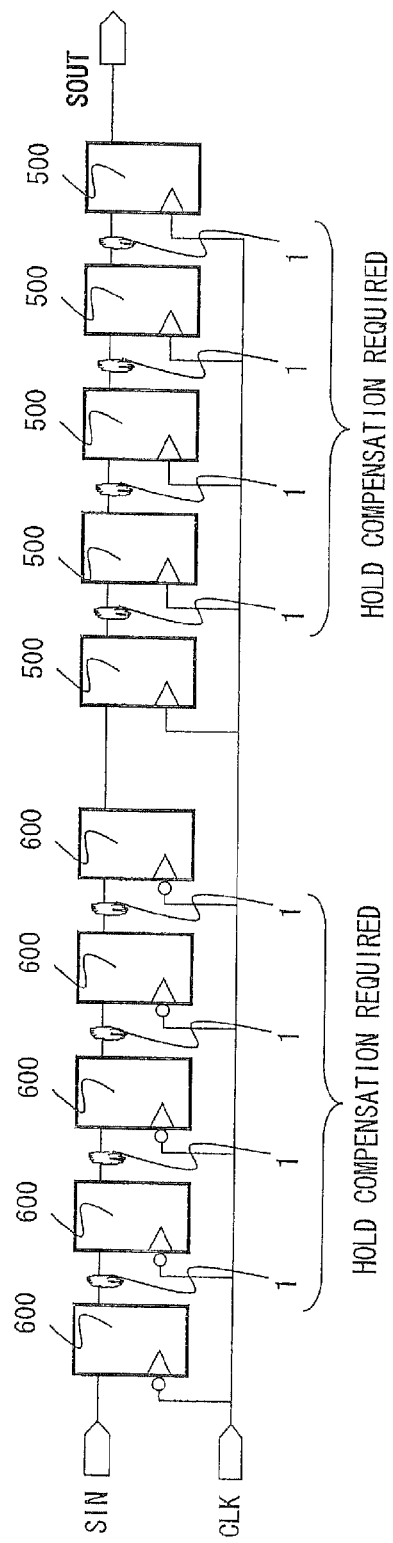
FIG. 33 is a view showing an example in which a scan chain is formed of FFs of MUSCAN type.

In the scan test circuit according to the first embodiment, a buffer (delay element) for performing hold compensation is required to be arranged in the pass 10 that connects the Pos-type F/F 100 and the Neg-type F/F 200. However, unlike FIG. 33, there is no need to provide a large number of hold compensation buffers as in the related scan test circuit.

Figure 8:
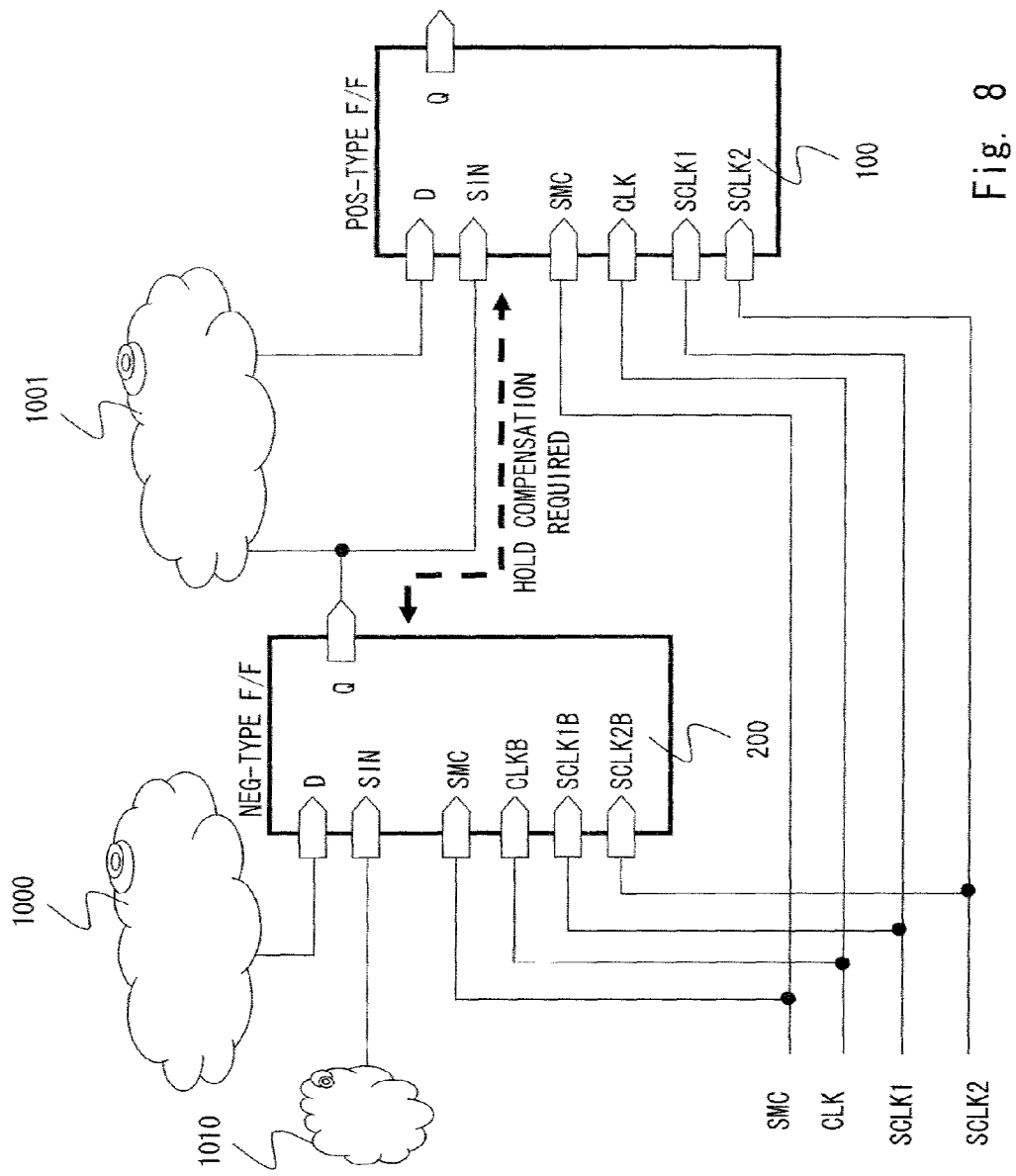
FIG. 8 is a view showing a scan test circuit when a data output Q of the Neg-type F/F 200 and a scan shift data input SIN of the Pos-type F/F 100 are connected according to the first embodiment of the present invention.
Figure 9:
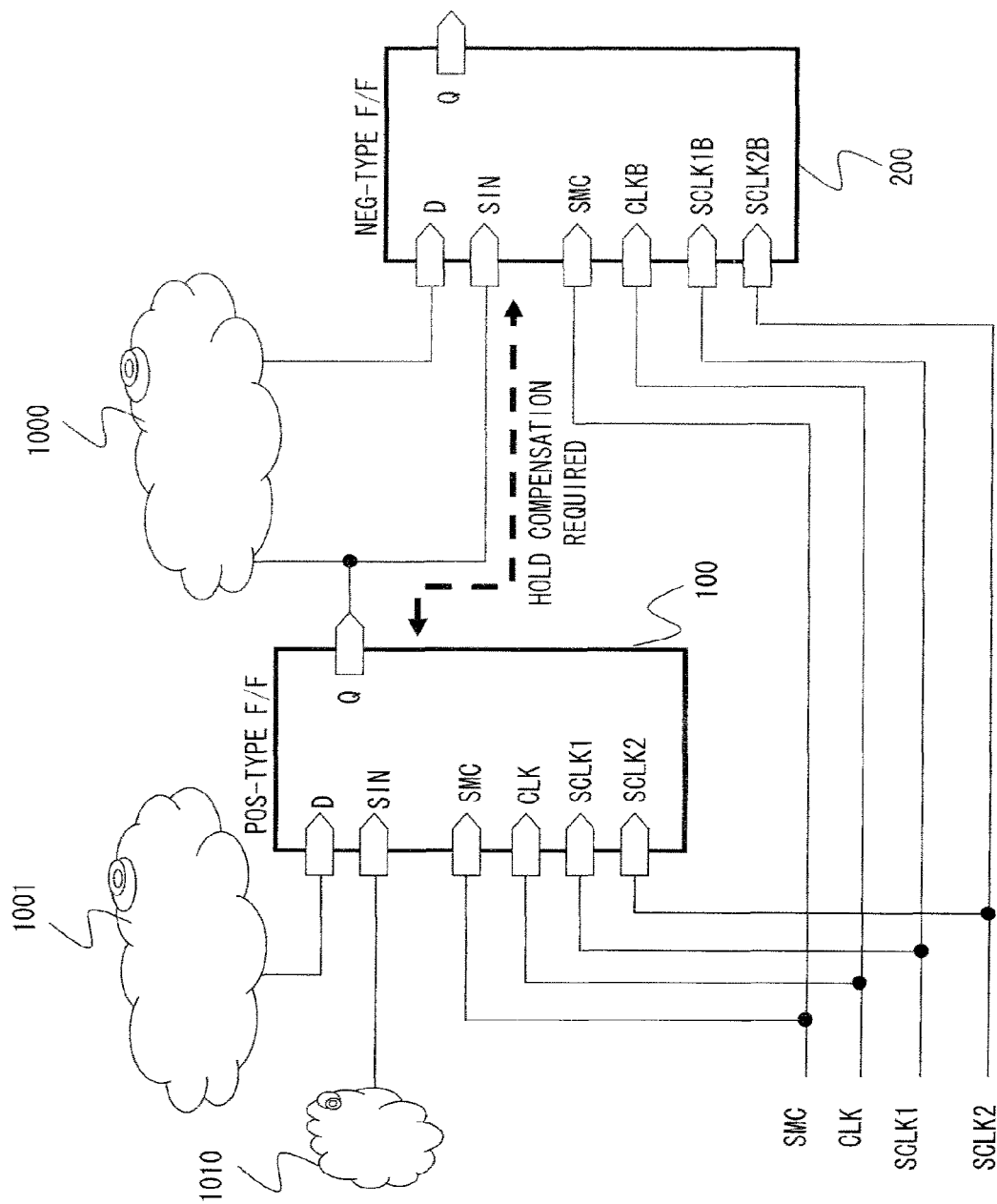
FIG. 9 is a view showing a scan test circuit when a data output Q of the Pos-type F/F 100 and a scan shift data input SIN of the Neg-type F/F 200 are connected according to the first embodiment of the present invention.
Figure 32:
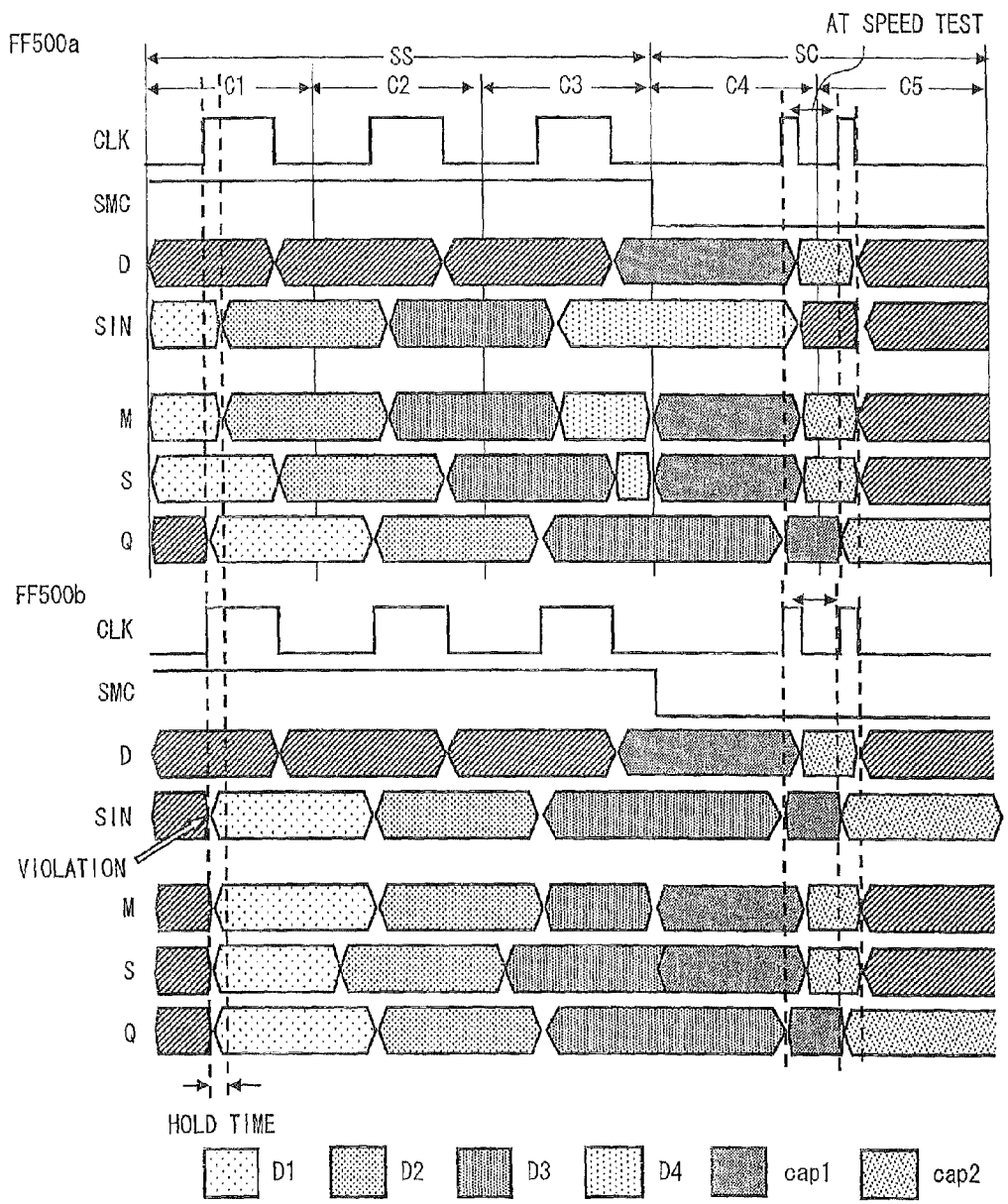
FIG. 32 is a timing chart showing an operation of the F/Fs of MUXSCAN type (Pos type) shown in FIG. 31.

FIG. 8 is a scan test circuit when the data output Q of the Neg-type F/F 200 and the scan shift data input SIN of the Pos-type F/F 100 are connected, and FIG. 9 shows a scan test circuit when the data output Q of the Pos-type F/F 100 and the scan shift data input SIN of the Neg-type F/F 200 are connected. As shown in FIGS. 8 and 9, a delay element for hold compensation is arranged in the pass 10 between the both F/Fs. When the hold compensation is not performed, as shown in FIG. 32, the subsequent F/F also outputs data at the timing at which the previous F/F outputs data. To address with this problem, a buffer that delays the scan shift data input SIN by a predetermined period is arranged for hold compensation.
<*2 START>

As shown in FIG. 8, the data input terminal D of the Neg-type F/F 200 receives input data from a user circuit 1000, the scan shift data input terminal SIN of the Neg-type F/F 200 receives data output from the data output terminal Q of a scan F/F 1010 which is previously provided, the scan mode control input terminal SMC of the Neg-type F/F 200 receives the scan mode control signal SMC, the clock terminal CLKB of the Neg-type F/F 200 receives the clock signal CLK in the normal operation, the scan clock terminal SCLK1B of the Neg-type F/F 200 receives the scan clock signal SCLK1, the scan clock terminal SCLK2B of the Neg-type F/F 200 receives the scan clock signal SCLK2, and the output Q of the Neg-type F/F 200 is supplied to the user circuit 1001 and to the scan shift data input SIN of the Pos-type F/F 100.

The data input terminal D of the Pos-type F/F 100 receives input data from the user circuit 1001, the scan shift data input terminal SIN of the Pos-type F/F 100 receives data output from the data output terminal Q of the Neg-type F/F 200, the scan mode control input terminal SMC of the Pos-type F/F 100 receives the scan mode control signal SMC as is similar to the scan mode control input terminal SMC of the Neg-type F/F 200, the clock terminal CLK of the Pos-type F/F 100 receives the clock signal CLK in the normal operation as is similar to the clock terminal CLKB of the Neg-type F/F 200, the scan clock terminal SCLK1 of the Pos-type F/F 100 receives the scan clock signal SCLK1 as is similar to the scan clock terminal SCLK1B of the Neg-type F/F 200, the scan clock terminal SCLK2 of the Pos-type F/F 100 receives the scan clock signal SCLK2 as is similar to the scan clock terminal SCLK2B of the Neg-type F/F 200, and the output Q of the Pos-type F/F 100 is supplied to a user circuit and to a scan shift data input terminal SIN of a scan F/F provided in the subsequent stage.

The scan test circuit shown in FIG. 9 is similar to that shown in FIG. 8 described above. Specifically, as shown in FIG. 9, the data input terminal D of the Pos-type F/F 100 receives input data from a user circuit 1001, the scan shift data input terminal SIN of the Pos-type F/F 100 receives data output from the data output terminal Q of the scan F/F 1010, the scan mode control input terminal SMC of the Pos-type F/F100 receives the scan mode control signal SMC, the clock terminal CLK of the Pos-type F/F 100 receives the clock signal CLK in the normal operation, the scan clock terminal SCLK1 of the Pos-type F/F 100 receives the scan clock signal SCLK1, the scan clock terminal SCLK2 of the Pos-type F/F 100 receives the scan clock signal SCLK2, and the output Q of the Pos-type F/F 100 is supplied to the user circuit 1000 and to the scan shift data input SIN of the Neg-type F/F 200.

The data input terminal D of the Neg-type F/F 200 receives input data from the user circuit 1000, the scan shift data input terminal SIN of the Neg-type F/F 200 receives data output from the data output terminal Q of the Pos-type F/F 100, the scan mode control input terminal SMC of the Neg-type F/F 200 receives the scan mode control signal SMC, the clock terminal CLKB of the Neg-type F/F 200 receives the clock signal CLK in the normal operation, the scan clock terminal SCLK1B of the Neg-type F/F 200 receives the scan clock signal SCLK1, the scan clock terminal SCLK2B of the Neg-type F/F 200 receives the scan clock signal SCLK2, and the output Q of the Neg-type F/F 200 is supplied to a user circuit and to a scan shift data input terminal SIN of a scan F/F provided in the subsequent stage.
<*2 END>

Figure 10:
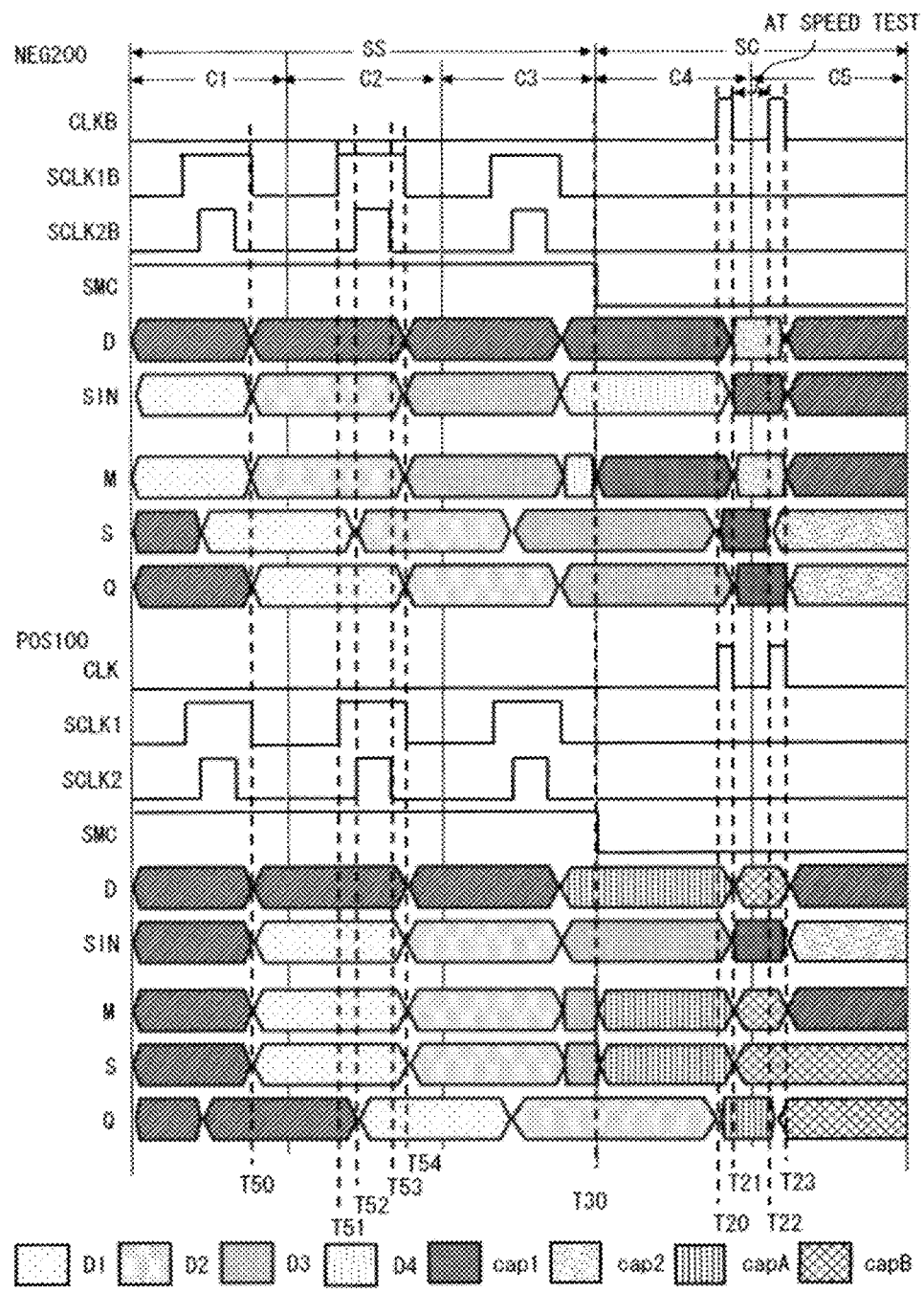
FIG. 10 is a timing chart showing an operation of the scan test circuit after hold compensation shown in FIG. 8 in the waveform type 1.
Figure 11:
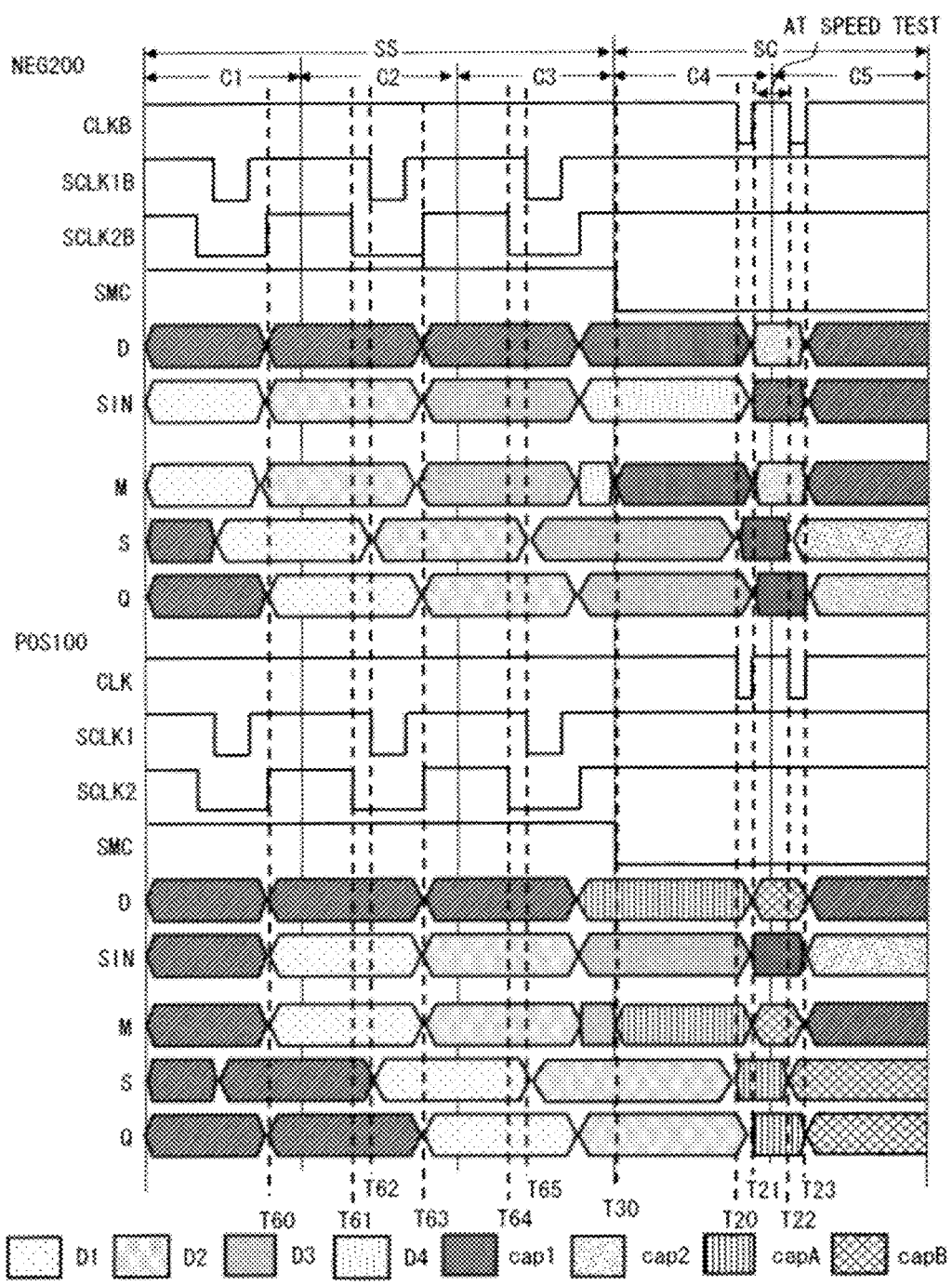
FIG. 11 is a timing chart showing an operation of the scan test circuit after hold compensation shown in FIG. 8 in the waveform type 2.
Figure 12:
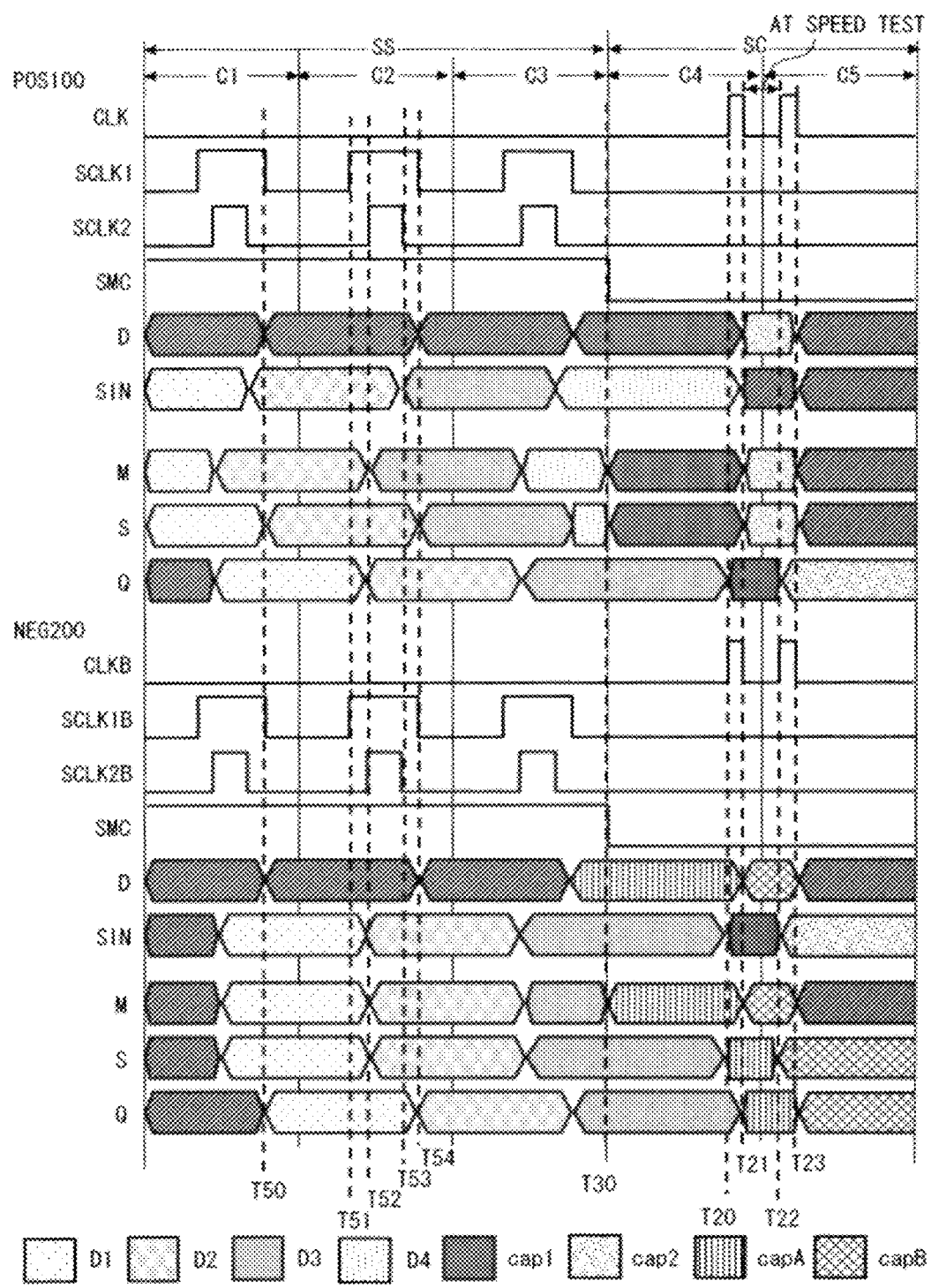
FIG. 12 is a timing chart showing an operation of the scan test circuit after hold compensation shown in FIG. 8 in the waveform type 1.
Figure 13:
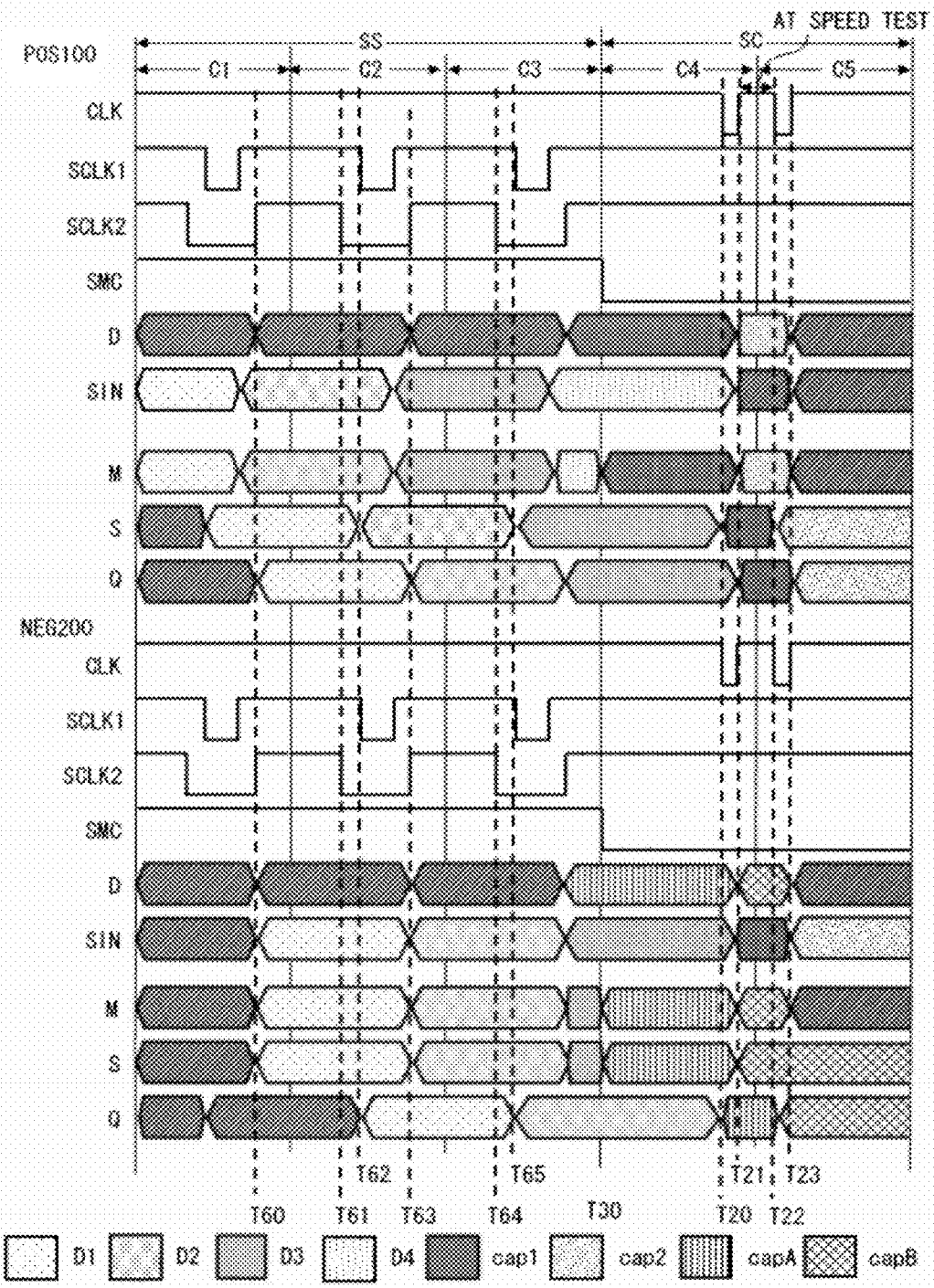
FIG. 13 is a timing chart showing an operation of the scan test circuit after hold compensation shown in FIG. 9 in the waveform type 2.

FIGS. 10 and 11 are timing charts showing the operation of the scan test circuit after hold compensation shown in FIG. 8 in the waveform types 1 and 2, respectively. FIGS. 12 and 13 are timing charts showing the operation of the scan test circuit after hold compensation shown in FIG. 9 in the waveform types 1 and 2, respectively. As shown in FIGS. 10 to 13, the scan shift data input SIN in the lower view is delayed compared to the scan shift data input SIN in the upper view by a predetermined period. For example, in FIG. 10, data D1 is output at time T50 in the Neg-type F/F 200 in the upper view, whereas the data output D1 is output at time T52 in the Pos-type F/F 100 in the lower view.

The operations are similar to those shown in FIGS. 3 to 6 described above. The master latch 210 of the Neg-type F/F 200 latches data at the rising timing of the scan shift clock signal SCLK2B (time T52), and the slave latch 211 latches data at the falling timing of the scan shift clock signal SCLK1B (time T54). The master latch 110 of the Pos-type F/F 100 latches data at the falling timing of the scan shift clock signal SCLK1 (time T54), and the slave latch 111 latches data at the rising timing of the scan shift clock signal SCLK2 (time T52).
<*3 START>

Next, the capture operation will be described with reference to clock cycles C4 and C5 with reference to FIG. 10. After time T30, since the scan mode control signal SMC is in the Low level, the normal clock signal is supplied to the master latch and the slave latch in any scan F/F.

At time T20, since the normal clock signal CLKB is raised, the master latch 210 of Neg-type F/F captures the capture data cap1 from the user circuit 1000. Further, at time T20, since the normal clock signal CLK is raised, the master latch 110 of Pos-type F/holds capture data capA from the user circuit 1001.

At time T21, since the normal clock signal CLKB is fallen, the slave latch 211 of Neg-type F/F captures output data cap1 from the master latch 210 of Neg-type F/F. Further, at time T21, since the normal clock signal CLKB is fallen, the master latch 210 of Neg-type F/F holds capture data cap1 from the user circuit 1000.

Further, at time T21, the master latch 110 of Pos-type F/F captures capture data capB from the user circuit 1001. Further, at time T21, the slave latch 111 of Pos-type F/F holds capture data capA from the master latch 110 of Pos-type F/F.

Next, at time T22, since the normal clock signal CLKB is raised, the master latch 210 of Neg-type F/F captures capture data cap2 from the user circuit 1000.

Further, at time T22, since the normal clock signal CLK is raised, the master latch 110 of Pos-type F/F holds capture data capB from the user circuit 1001. Further, at time T22, since the normal clock signal CLK is raised, the slave latch 111 of Pos-type F/F captures capture data capB from the master latch 110 of Pos-type F/F.

At time T23, since the normal clock signal CLKB is fallen, the slave latch 211 of Neg-type F/F captures output data cap2 from the master latch 210 of Neg-type F/F. Further, at time T23, since the normal clock signal CLKB is fallen, the master latch 210 of Neg-type F/F holds capture data cap2 from the user circuit 1000.
<*3 END>

The waveform type 2 shown in FIG. 11 is similar to that shown in FIG. 10. While the data output Q (D1) of the Neg-type F/F 200 is time T60, the data output Q of the Pos-type F/F 100 is time T63. The operation is similar to that described above. The master latch 210 of the Neg-type F/F 200 latches data at the rising timing of the scan shift clock signal SCLK2B (time T60), and the slave latch 211 latches data at the falling timing of the scan shift clock signal SCLK1B (time T62). The master latch 110 of the Pos-type F/F 100 latches data at the falling timing of the scan shift clock signal SCLK1 (time T62 and T65), and the slave latch 111 latches data at the rising timing of the scan shift clock signal SCLK2 (time T60 and T63).

FIGS. 12 and 13 show a case in which the connection is made from the Pos-type F/F 100 to the Neg-type F/F 200, and the basic operations are similar to those shown in FIGS. 10 and 11.

In the first embodiment, two kinds of scan shift clock signals are input. Accordingly, in the scan operation (the scan mode control signal SMC is in the High level), the Pos-type F/F 100 supplies the scan shift clock signal SCLK1 to the master latch 110 and supplies the scan clock signal SCLK2 to the slave latch 111, and the Neg-type F/F 200 supplies the scan clock signal SCLK2B to the master latch 210 and supplies the scan shift clock signal SCLK1B to the slave latch 211. In the normal operation (the scan mode control signal SMC is in the Low level), the clock normal signal CLK (CLKB) is supplied to both of the master latch 110 and the slave latch 111 of the Pos-type F/F 100 and the master latch 210 and the slave latch 211 of the Neg-type F/F 200.

As to the clock signal input in the scan test operation, the rising edges of the scan shift clock signal SCLK1 (SCLK1B) are located before the rising edges of the scan shift clock signal SCLK2 (SCLK2B) and the falling edges are located after the falling edges of the scan shift clock signal SCLK2 (SCLK2B) (waveform type 1), or the falling edges of the scan shift clock signal SCLK1 (SCLK1B) are located before the falling edges of the scan shift clock signal SCLK2 (SCLK2B) and the rising edges are located after the rising edges of the scan shift clock signal SCLK2 (SCLK2B) (waveform type 2). Specifically, when the transition delay failure test between circuits in which the Neg-type F/Fs and the Pos-type F/Fs are connected is executed by using such a scan shift clock signal that the scan shift clock signal SCLK2 (SCLK2B) is in the Low level when the scan shift clock signal SCLK (SCLK1B) is in the Low level, and the scan shift clock signal SCLK (SCLK1B) is in the High level when the scan shift clock signal SCLK2 (SCLK2B) is in the High level, the test data D1 input to the scan shift data input SIN of the Neg-type F/F 200 in one clock cycle period C1 is not output from the data output terminal Q of the Pos-type F/F 100 but is output in the next clock cycle period C2. In this way, it is possible to perform the correct shift operation and to perform the transition delay failure test.

Further, the Pos-type F/F 100 and the Neg-type F/F 200 operate by the same scan shift clock signals SCLK1 and SCLK2 (=SCLK1B, SCLK2B). In summary, there is no need to invert the clock signals unlike the flip-flop of LSSD type. Accordingly, it is possible to perform the delay failure test in the actual operating frequency.

Figure 19:
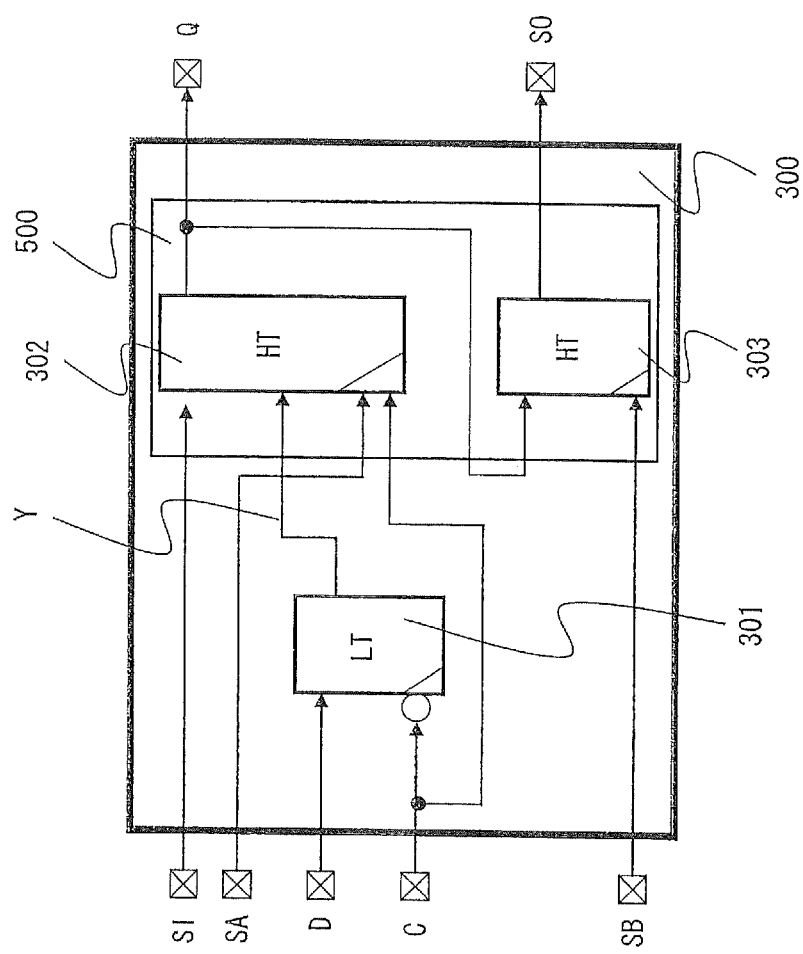
FIG. 19 is a circuit view showing a related Pos-type F/F circuit.
Figure 20:
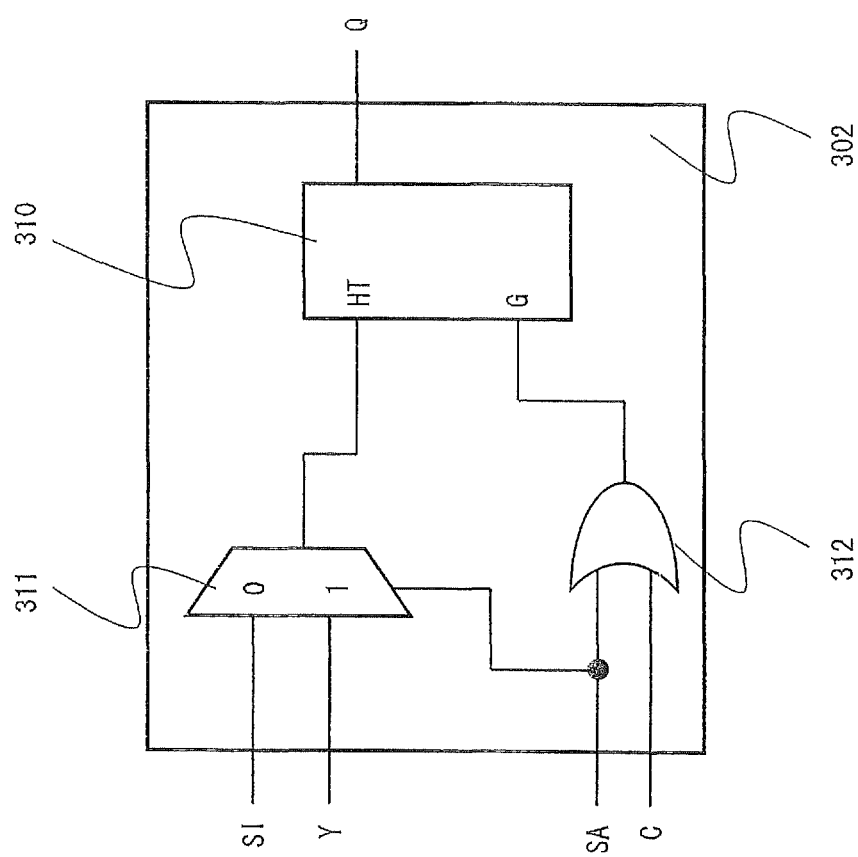
FIG. 20 is a circuit view showing an example of detail of a latch circuit 302 of the Pos-type F/F 300 shown in FIG. 19.
Figure 21:
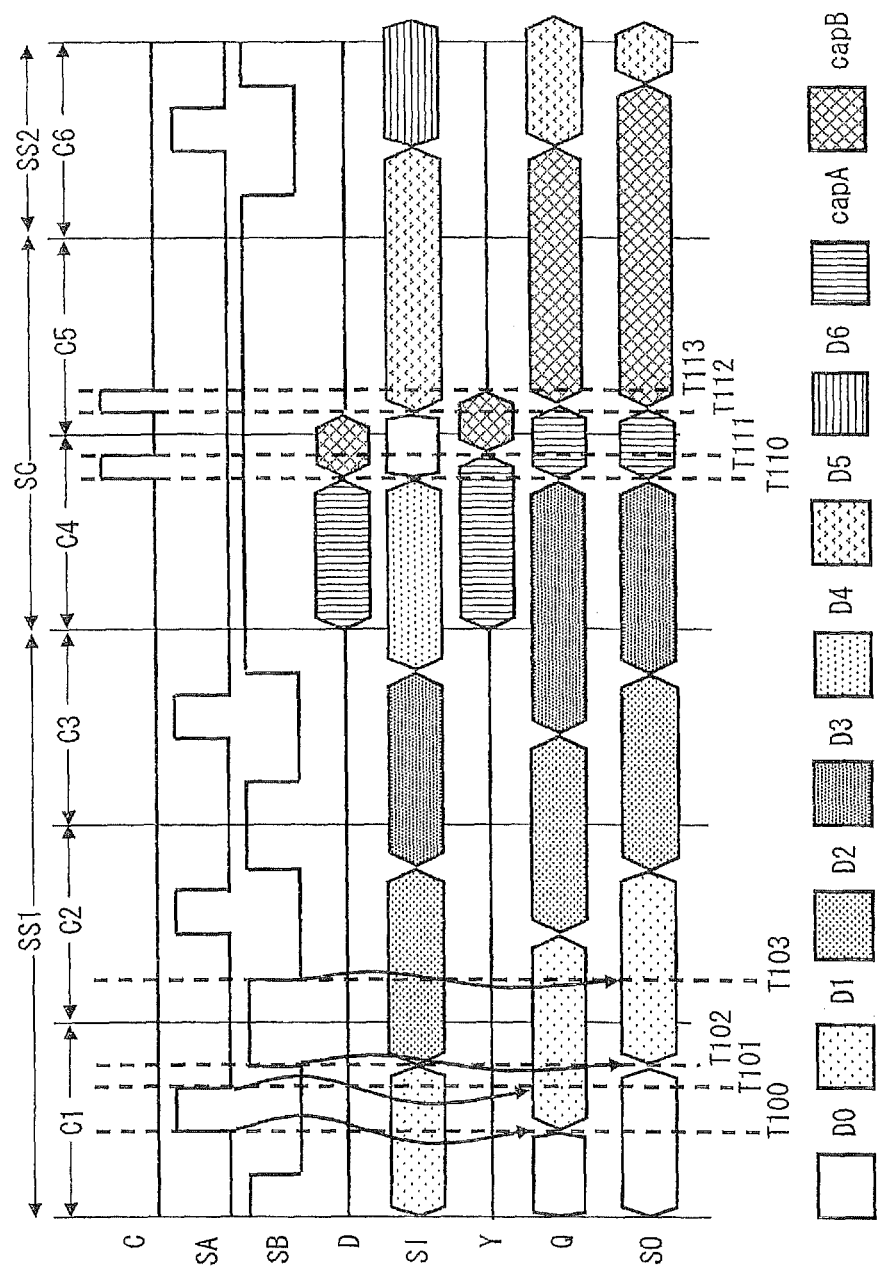
FIG. 21 is a timing chart showing an operation of a transition delay test using the Pos-type F/F 300 shown in FIG. 19.
Figure 22:
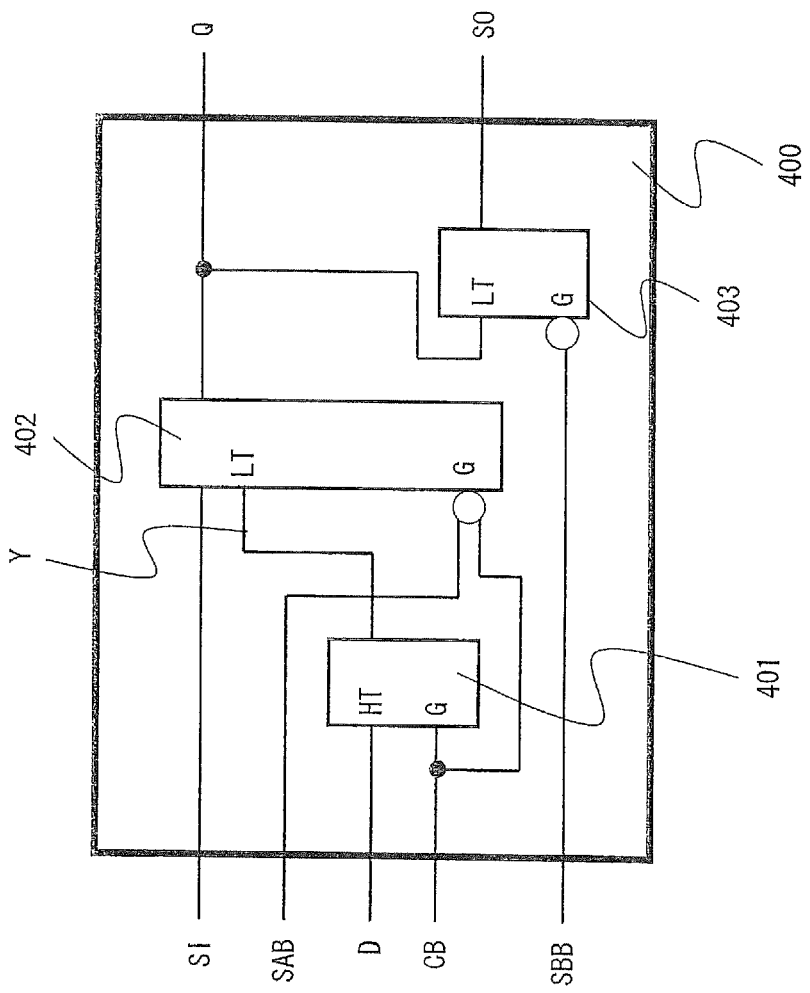
FIG. 22 is a circuit view showing a related Neg-type F/F circuit.
Figure 23:
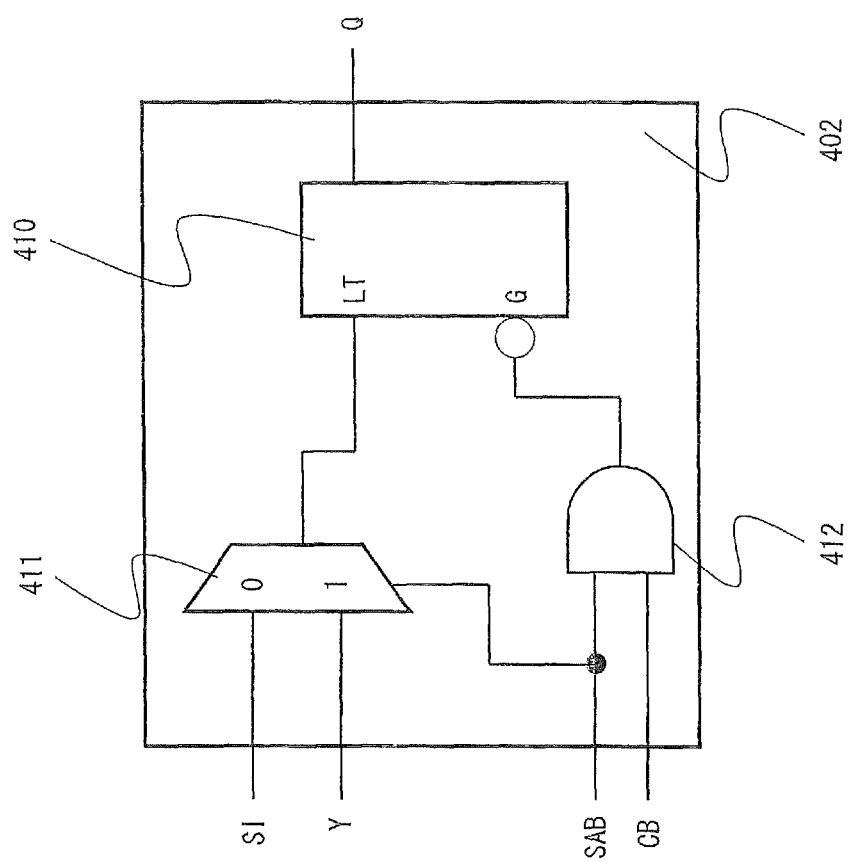
FIG. 23 is a circuit view showing an example of detail of a latch circuit 402 of the Neg-type F/F 400 shown in FIG. 22.
Figure 24:
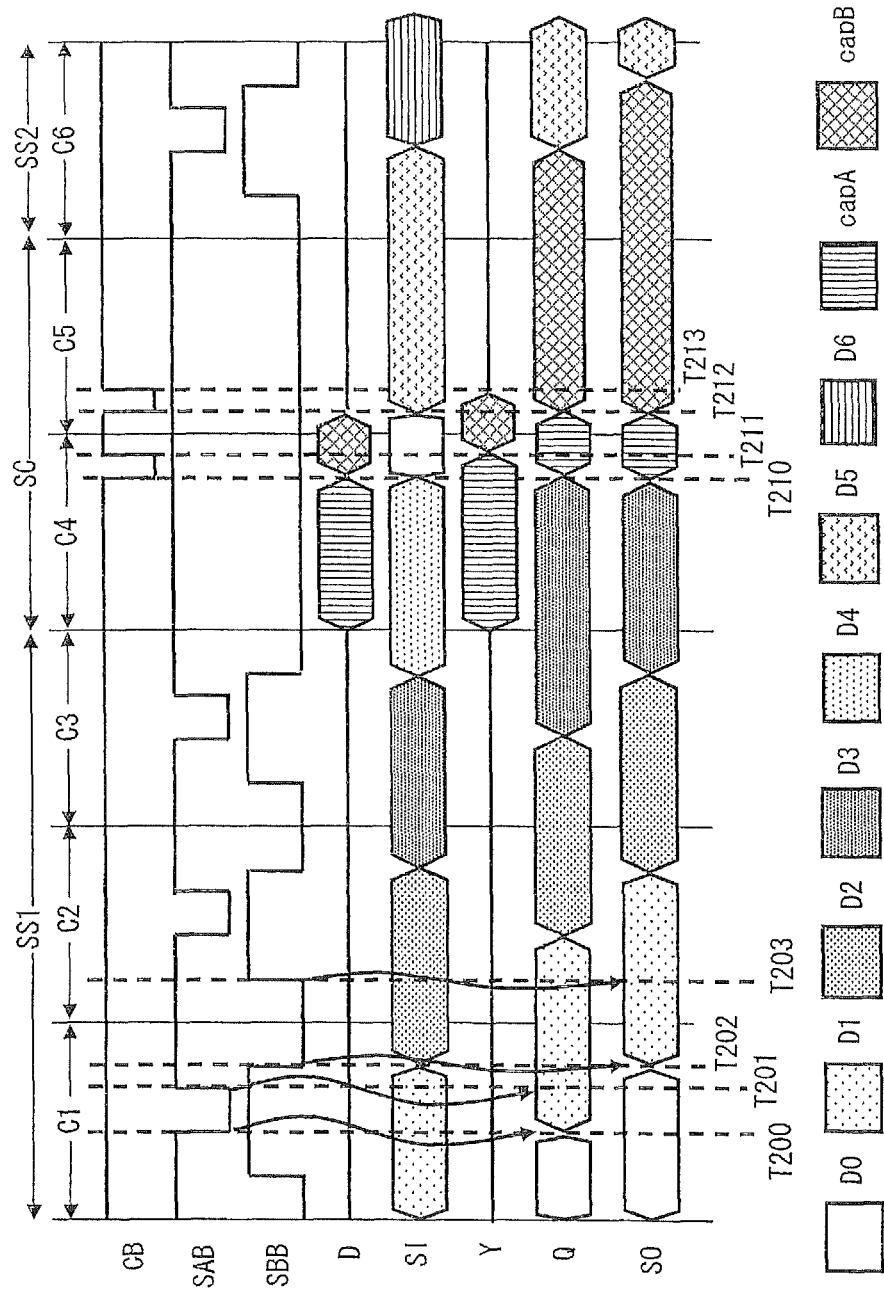
FIG. 24 is a timing chart showing an operation of the transition delay test using the Neg-type F/F 400 shown in FIG. 22.
Figure 25:
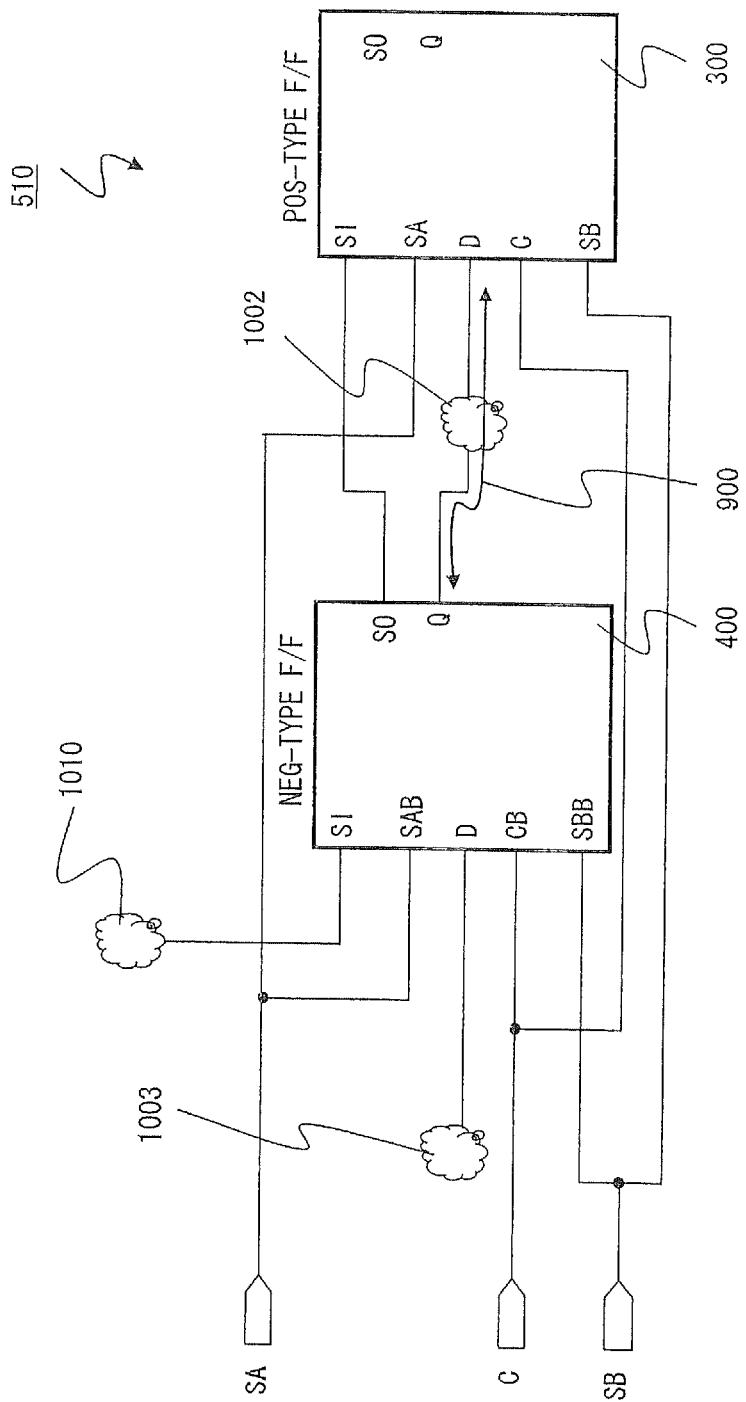
FIG. 25 is a view showing a configuration of a scan test circuit in a circuit where a Neg-type F/F and a Pos-type F/F are connected.
Figure 26:
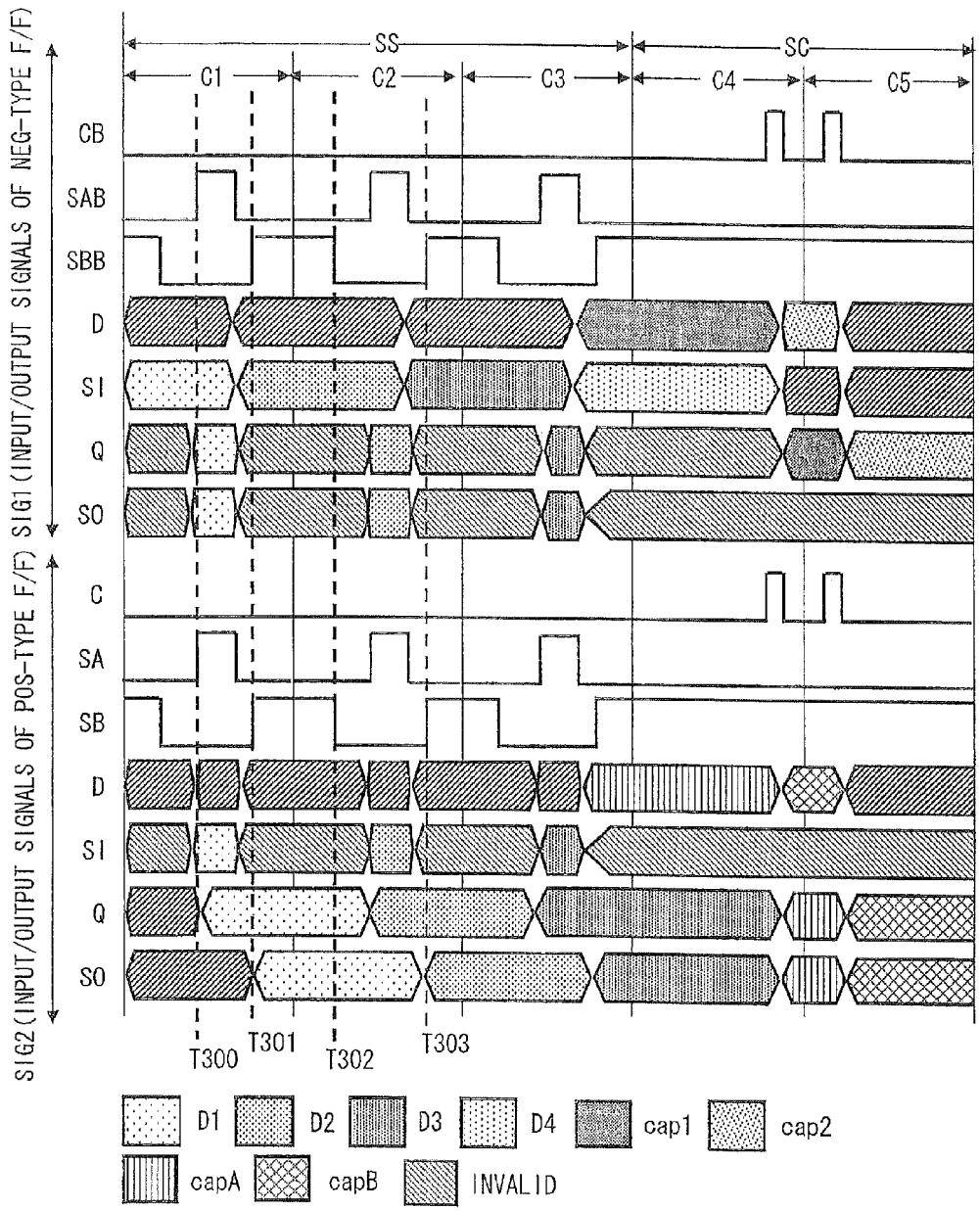
FIG. 26 is a timing chart showing a scan shift operation in the related scan test circuit shown in FIG. 25.
Figure 27:
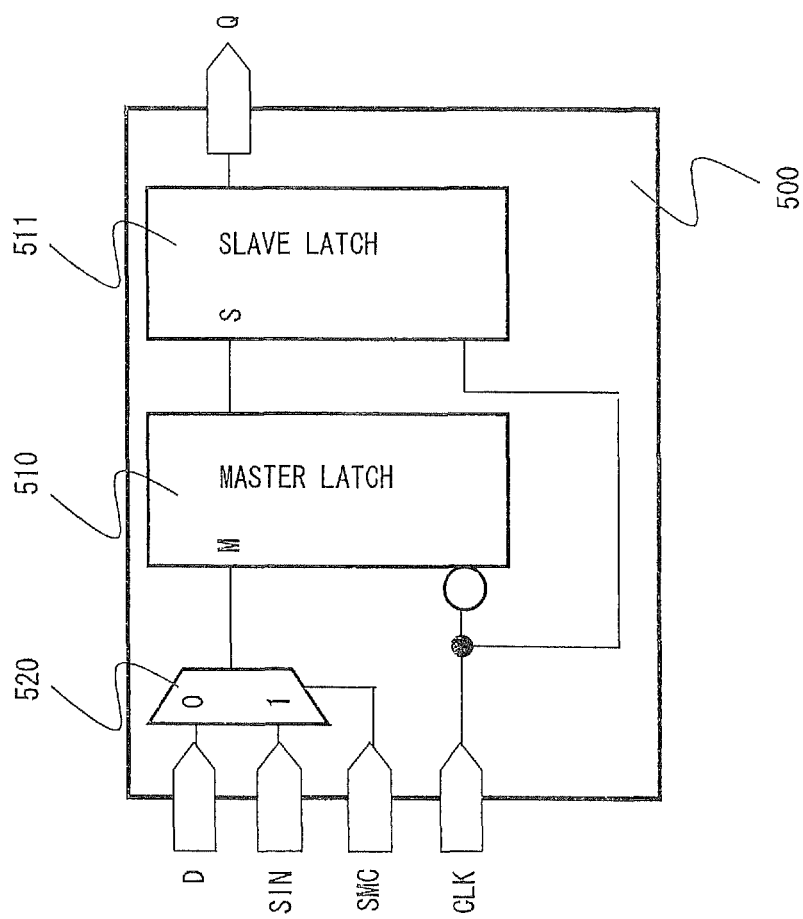
FIG. 27 is a circuit view showing an F/F of Pos-type which is an F/F of MUXSCAN type.
Figure 28:
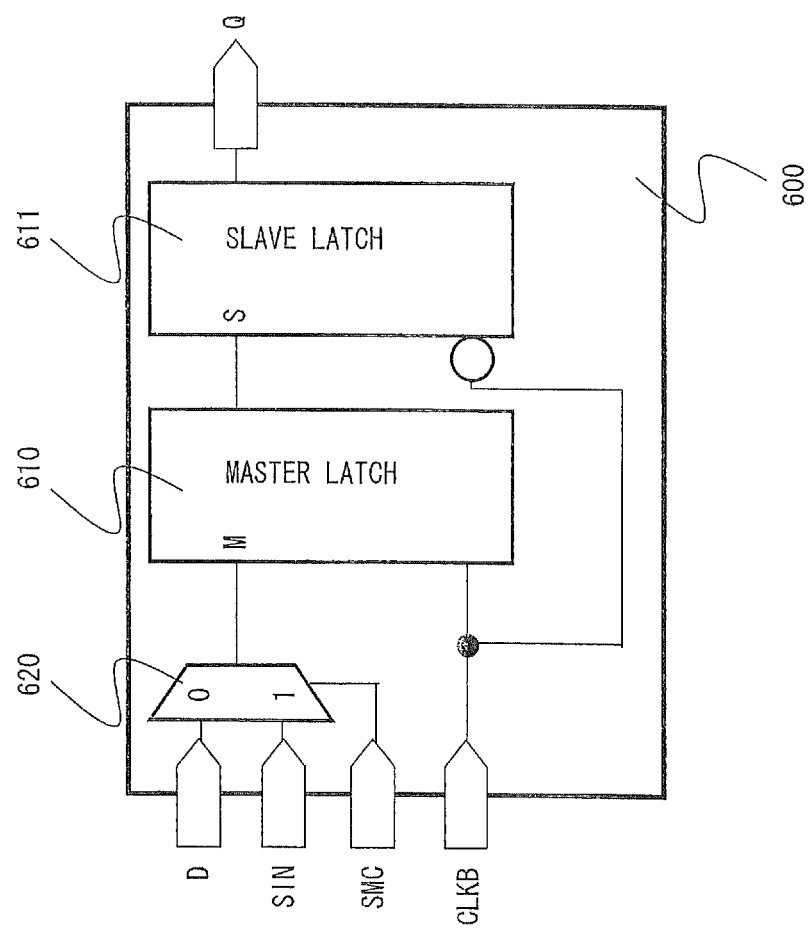
FIG. 28 is a circuit view showing an F/F of Neg-type which is an F/F of MUXSCAN type.
Figure 29:
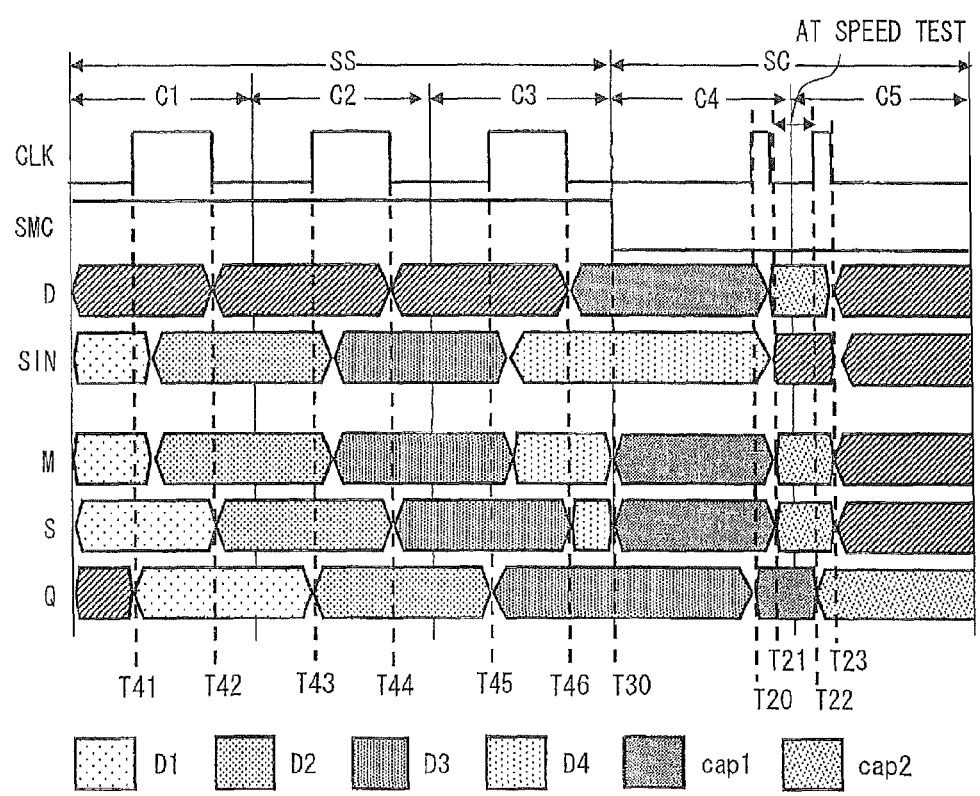
FIG. 29 is a timing chart showing an operation of the F/F of MUXSCAN type (Pos type)
Figure 30:
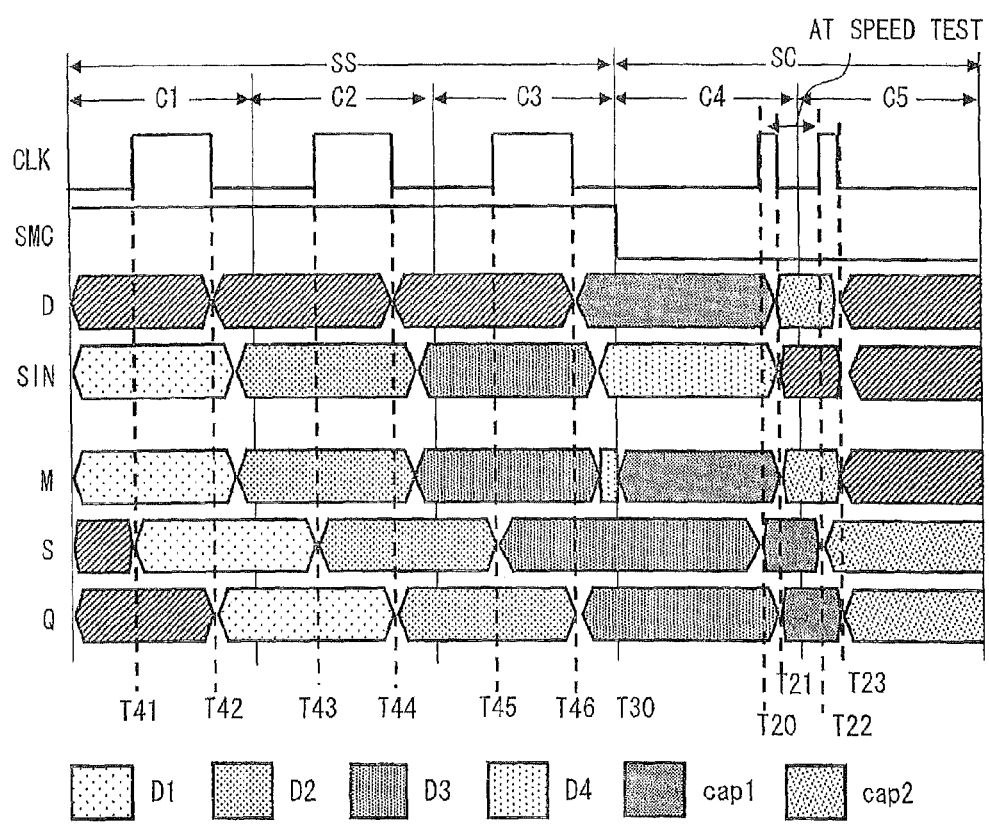
FIG. 30 is a timing chart showing an operation of the F/F of MUXSCAN type (Neg type)
Figure 31:
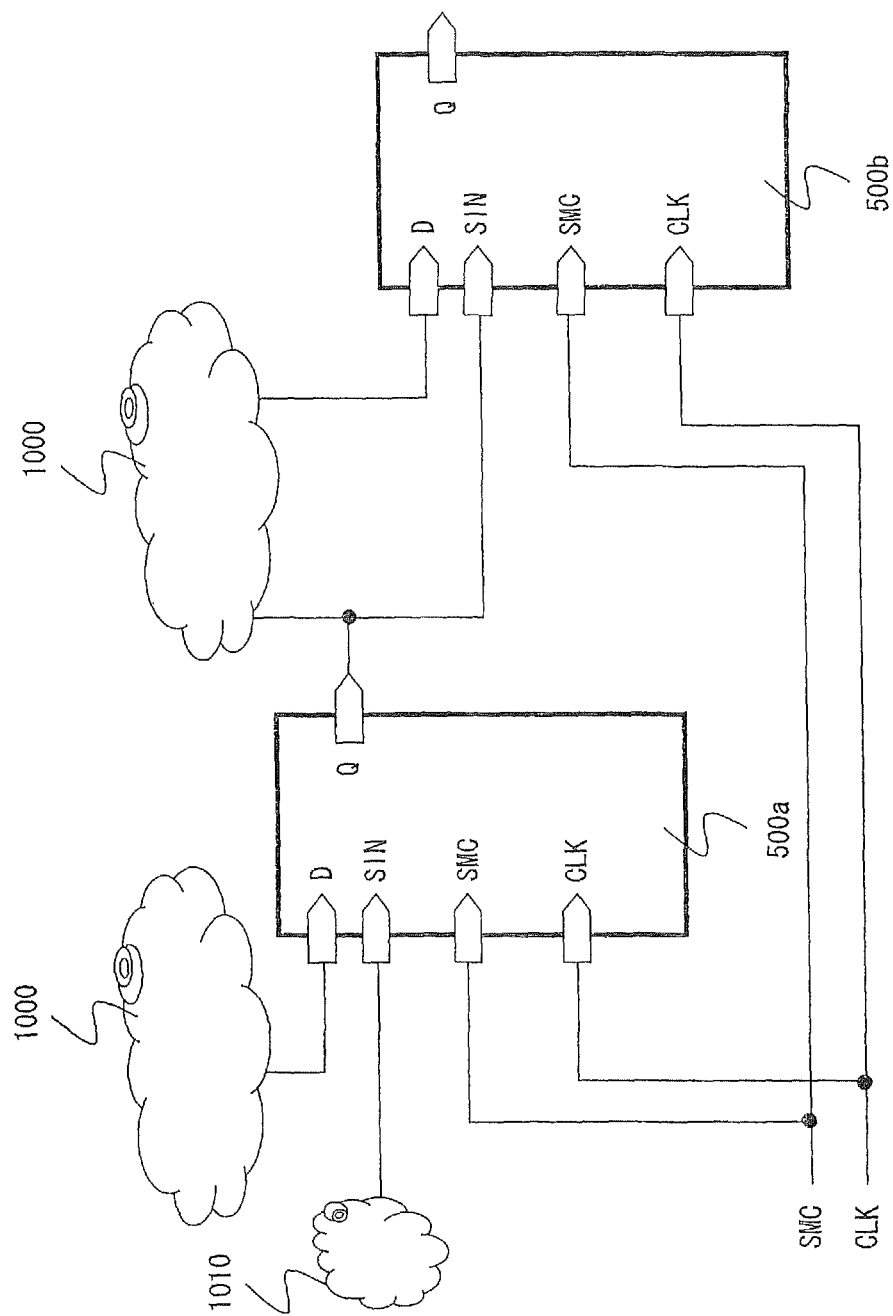
FIG. 31 is a view showing a circuit configuration in which F/Fs of MUXSCAN type (Pos type) are connected.

Furthermore, while the latch circuit of the flip-flop of LSSD type requires three latch circuits of a latch circuit 301, a latch circuit 302, and a latch circuit 303 as shown in FIG. 19, the first embodiment only requires two latch circuits of the master latch circuit 110 and the slave latch circuit 111, thereby decreasing the gate size.

Second Embodiment of the Present Invention

Next, a second embodiment of the present invention will be described. In the first embodiment described above, two kinds of scan shift clock signals are input to the scan F/F. On the other hand, in the second embodiment, only one kind of scan shift clock signal is input instead of two kinds of scan shift clock signals, and the other signal is substituted by a normal clock signal. Accordingly, only one kind of scan shift clock signal is input, which requires only one selector that selects the signal.

Figure 14:
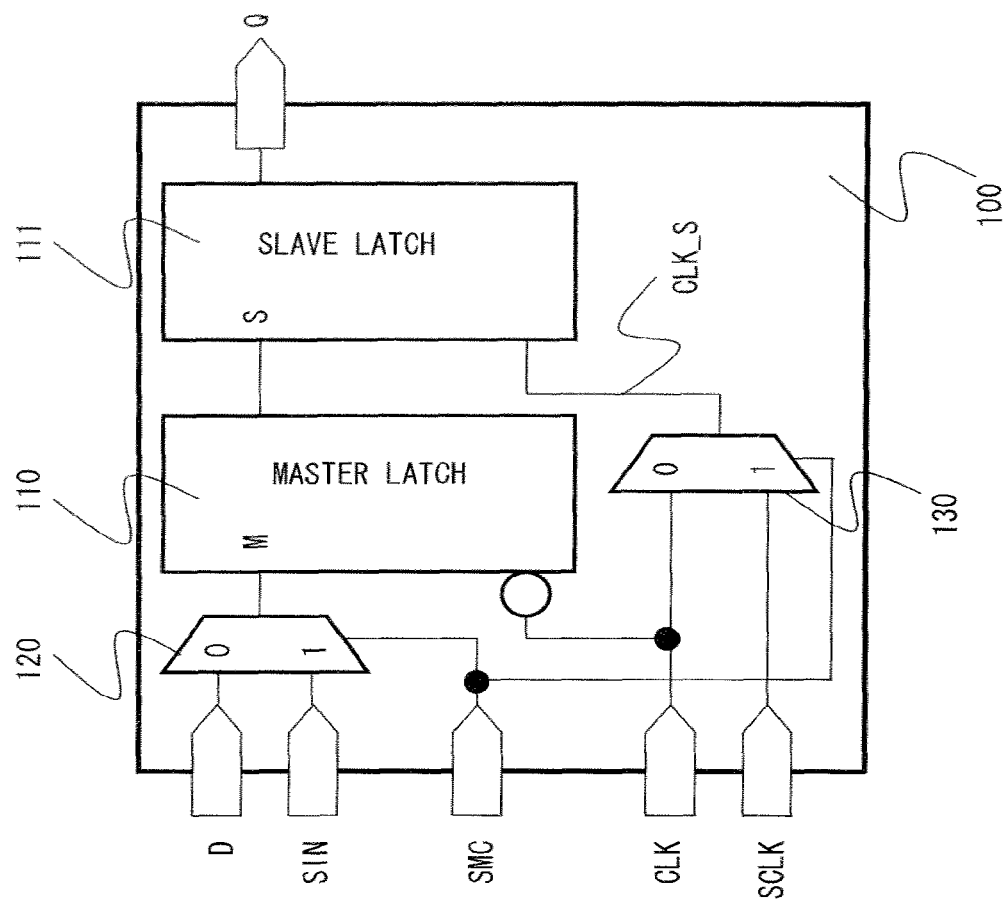
FIG. 14 is a circuit view showing a Pos-type F/F 100 according to a second embodiment of the present invention.

FIG. 14 is a circuit view showing a Pos-type F/F 100 according to the second embodiment of the present invention. As shown in FIG. 14, the Pos-type F/F 100 includes a master latch 110 which is a Low level latch, a slave latch 111 which is a High level latch, and selectors 120 and 130, as is similar to the first embodiment. In short, there is no need to provide a selector 140 shown in FIG. 1.

The selector 120 receives a data signal and scan shift data. The selector 120 selects a scan shift data input SIN when a scan mode control signal SMC is in a High level, and selects a data input D in the normal operation when the SMC is in a Low level.

The selector 130 receives a scan shift clock signal SCLK and a normal clock signal CLK. The selector 130 selects the scan shift clock signal SCLK when the scan mode control signal SMC is in the High level, and selects the normal clock signal CLK when the SMC is in the Low level. The selector 130 then outputs the selected signal as a clock signal CLK_S.

A data input terminal of the master latch 110 receives the output of the selector 120, and a latch signal terminal of the master latch 110 receives the normal clock signal CLK.

A data input terminal of the slave latch 111 receives the data output of the master latch 110, and a latch signal terminal of the slave latch 111 receives the output of the selector 130 (clock signal CLK_S).

Figure 15:
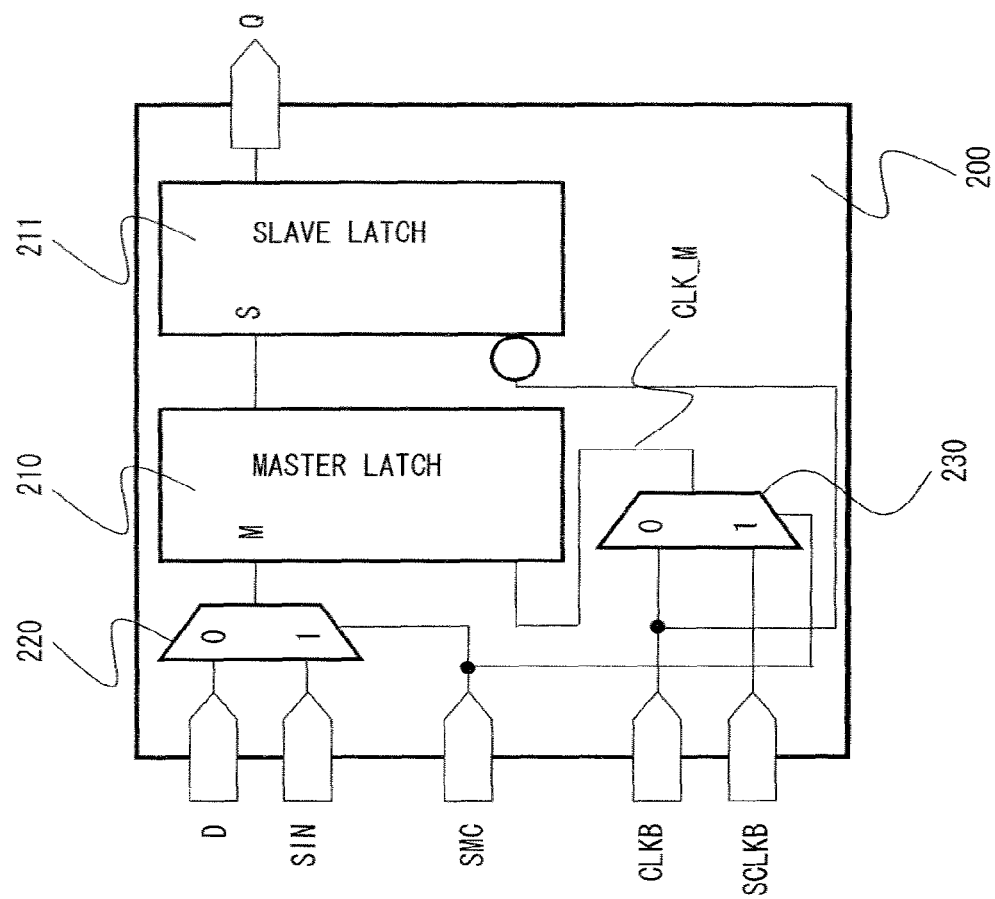
FIG. 15 is a circuit view showing a Neg-type F/F 200 according to the second embodiment of the present invention.

FIG. 15 is a circuit view showing a Neg-type F/F 200 according to the second embodiment. As shown in FIG. 15, the Neg-type F/F 200 includes a master latch 210 which is a High level latch, a slave latch 211 which is a Low level latch, and selectors 220 and 230, as is similar to the first embodiment. In short, there is no need to provide the selector 240 shown in FIG. 2.

The selector 220 receives a data signal and scan shift data. The selector 220 selects a scan shift data input SIN when a scan mode control signal SMC is in the High level, and selects a data input D in the normal operation when the SMC is in the Low level.

The selector 230 receives a scan shift clock signal SCLKB and a normal clock signal CLKB. The selector 230 selects the scan shift clock signal SCLKB when the scan mode control signal SMC is in the High level, and selects the normal clock signal CLKB when the SMC is in the Low level. The selector 230 then outputs the selected signal as a clock signal CLK_M.

A data input terminal of the master latch 210 receives the output from the selector 220, and a latch signal terminal of the master latch 210 receives the output (clock signal CLK_M) of the selector 230.

A data input terminal of the slave latch 211 receives the data output of the master latch 210, and a latch signal terminal of the slave latch 211 receives the normal clock signal CLKB.

Figure 16:
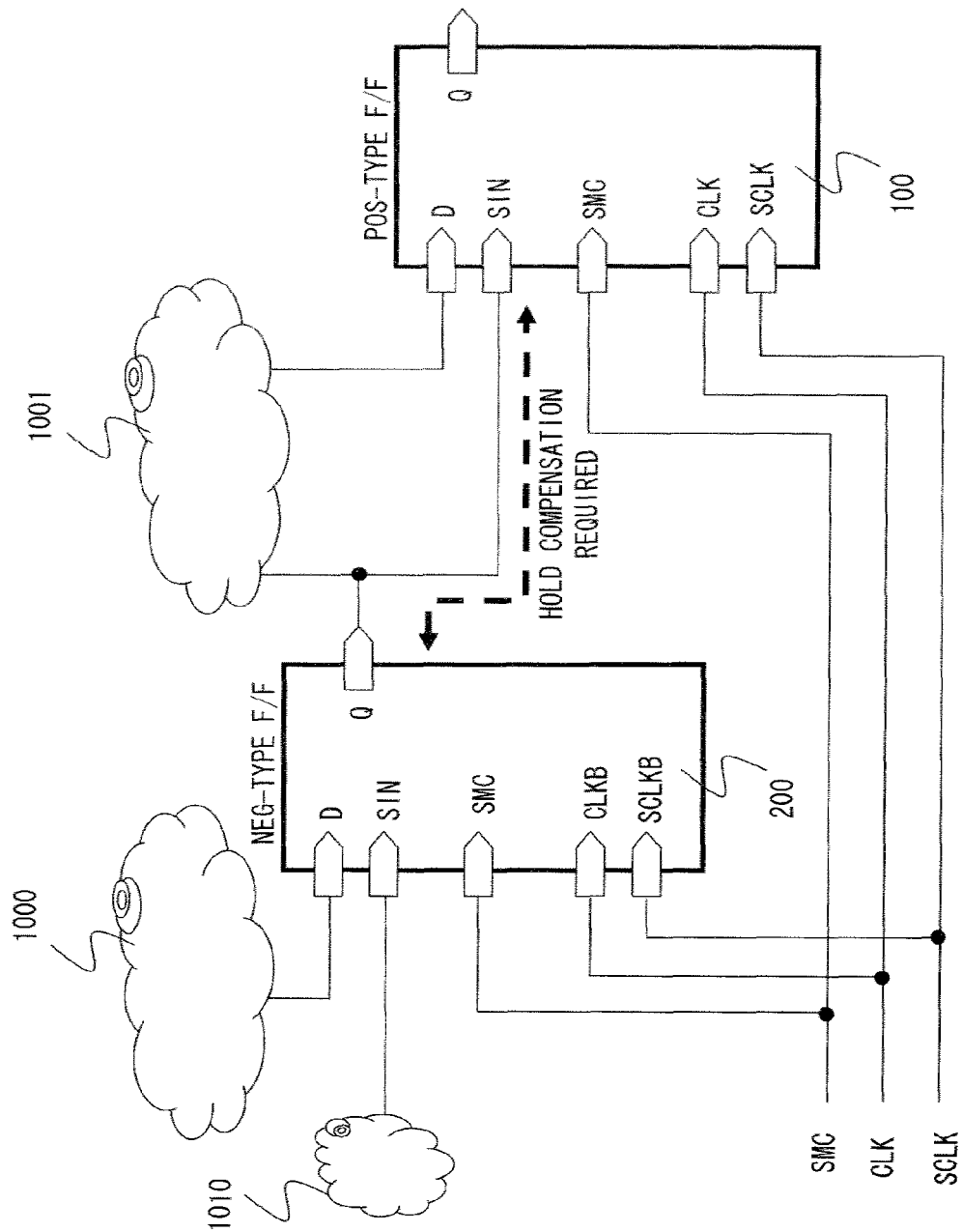
FIG. 16 is a view showing a scan test circuit when the Pos-type F/F and the Neg-type F/F shown in FIGS. 14 and 15 are connected by a scan chain.

FIG. 16 is a view showing a scan test circuit when the Pos-type F/F shown in FIG. 14 and the Neg-type F/F shown in FIG. 15 are connected by a scan chain. As shown in FIG. 16, in the scan test circuit, the Neg-type F/F 200 is provided in the previous stage of the Pos-type F/F 100.

The data input terminal D of the Neg-type F/F 200 receives input data from the user circuit 1000, the scan shift data input terminal SIN of the Neg-type F/F 200 receives the output from the data output terminal Q of the scan F/F 1010 which is previously provided, the scan mode control input terminal SMC of the Neg-type F/F 200 receives the scan mode control signal SMC, the clock terminal CLKB of the Neg-type F/F 200 receives the clock signal CLK in the normal operation, the scan clock terminal SCLKB of the Neg-type F/F 200 receives the scan clock signal SCLK, and the output Q of the Neg-type F/F 200 is supplied to the user circuit 1001 and to the scan shift data input SIN of the Pos-type F/F 100.

The data input terminal D of the Pos-type F/F 100 receives input data from the user circuit 1001, the scan shift data input terminal SIN of the Pos-type F/F 100 receives data output from the data output terminal Q of the Neg-type F/F 200, the scan mode control input terminal SMC of the Pos-type F/F 100 receives the scan mode control signal SMC as is similar to the scan mode control input terminal SMC of the Neg-type F/F 200, the clock terminal CLK of the Pos-type F/F 100 receives the clock signal CLK in the normal operation as is similar to the clock terminal CLKB of the Neg-type F/F 200, the scan clock terminal SCLK of the Pos-type F/F 100 receives the scan clock signal SCLK as is similar to the scan clock terminal SCLKB of the Neg-type F/F 200, and the output Q of the Pos-type F/F 100 is supplied to a user circuit and to a scan shift data input terminal SIN of a scan F/F provided in the subsequent stage.

Figure 17:
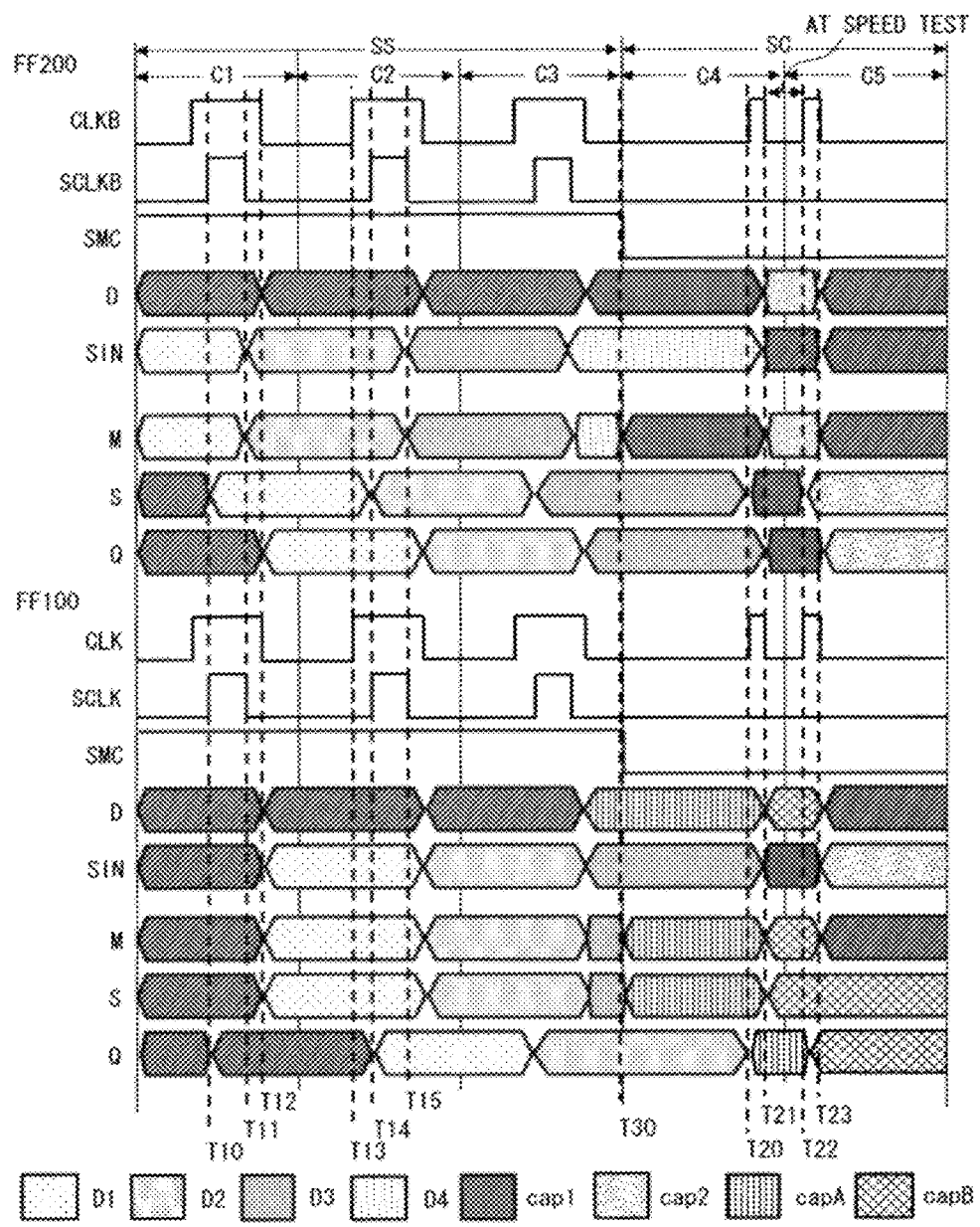
FIG. 17 is a timing chart showing an operation of the scan test circuit according to the second embodiment of the present invention.
Figure 18:
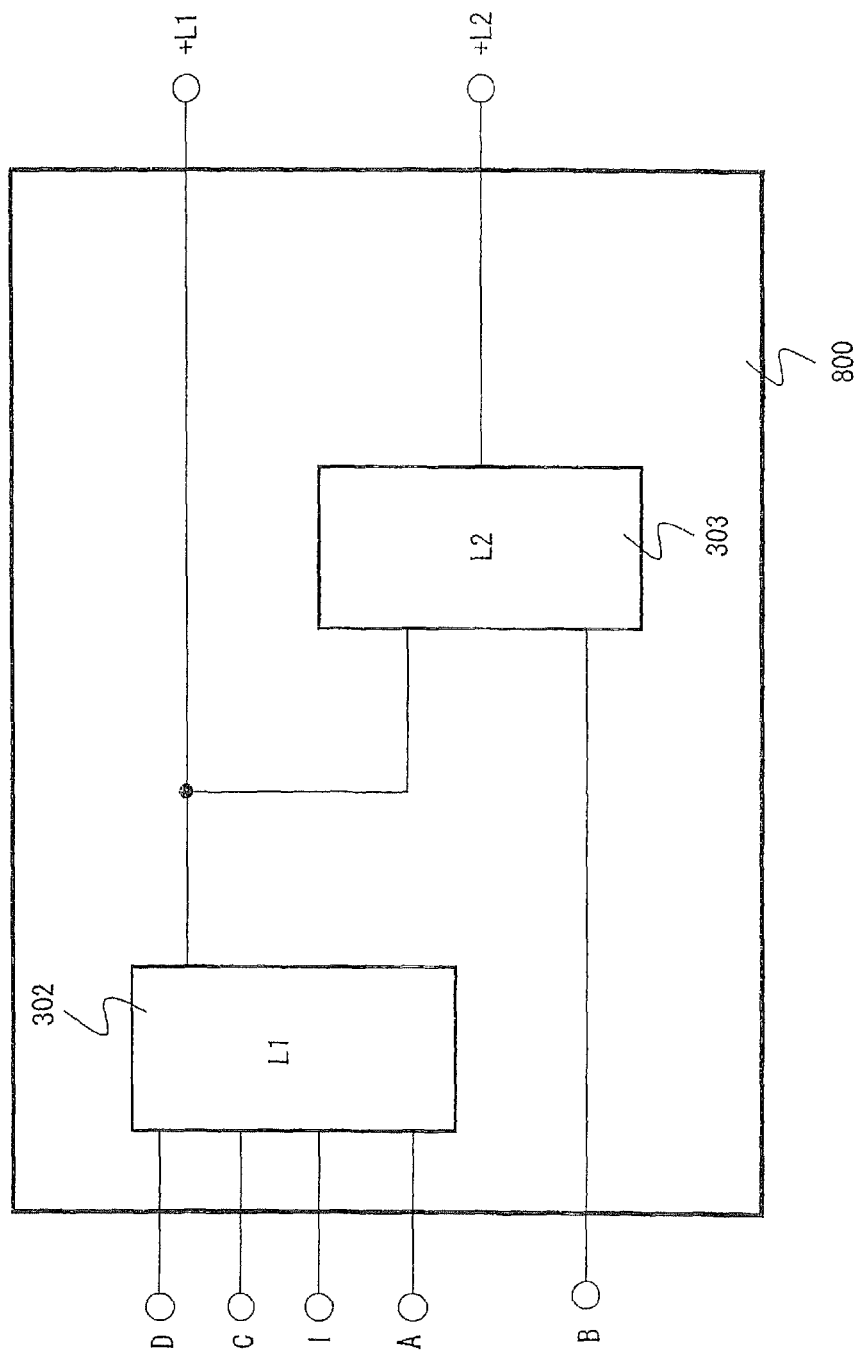
FIG. 18 is a view showing a representative LSSD latch circuit disclosed in a cited literature.

FIG. 17 is a timing chart showing an operation of the scan test circuit shown in FIG. 16. An operation of the scan test circuit shown in FIG. 17 is similar to the operation of the scan test circuit shown in FIGS. 12 and 13 in the first embodiment except clock signals that are used. Further, in the second embodiment as well, when the Pos-type F/F 100 and the Neg-type F/F 200 are connected, a delay circuit is arranged in a data line of the scan shift data input SIN to perform hold compensation.

FIG. 17 shows the normal clock signal CLKB, the scan clock signal SCLKB, the scan mode control signal SMC, the output signal D from the user circuit 1000, the scan shift data input SIN from the previous scan flip-flop 1010, the input M of the master latch, the input S of the slave latch, and the data output Q in the Neg-type F/F 200. Further, FIG. 17 shows the normal clock signal CLK, the scan clock signal SCLK, the scan mode control signal SMC, the output signal D from the user circuit 1001, the scan shift data input SIN from the previous scan flip-flop, the input M of the master latch, the input S of the slave latch, and the data output Q in the Pos-type F/F 100. FIG. 17 shows changes in the levels of these signals in the periods of a scan shift cycle SS and a scan capture cycle SC.

It is assumed here that the scan shift cycle SS includes clock cycles C1, C2, and C3, and the scan capture cycle SC includes C4 and C5. In this case, the scan shift cycle SS indicates the last three cycle periods of the scan shift operation, and the scan capture cycle SC indicates the scan capture operation period.

First, the scan shift operation will be described using clock cycles C1 and C2. The scan mode control signal SMC becomes the High level in the period of the scan shift cycle SS, becomes the Low level at time T30, and keeps the Low level in the period of the scan capture cycle SC.

At time T10, since the scan clock signal SCLKB is raised, the master latch 210 of Neg-type F/F captures test data D1 from the scan shift data input terminal SIN.

At time T11, since the scan clock signal SCLKB is fallen, the master latch 210 of Neg-type F/F holds the test data D1 from the scan shift data input terminal SIN.

At time T12, since the normal clock signal CLKB is fallen, the slave latch 211 of Neg-type F/F captures the test data D1 from the master latch 210 of Neg-type F/F and outputs the test data D1 to the data output terminal Q. Further, at time T12, since the normal clock signal CLK is fallen, the master latch 110 of Pos-type F/F captures the test data D1 from the Neg-type F/F.

At time T13, since the normal clock signal CLKB is raised, the slave latch 211 of Neg-type F/F holds the test data D1 from the master latch 210 of Neg-type F/F.

At time T14, since the shift clock signal SCLK is raised, the slave latch 111 of Pos-type F/F captures the test data D1 from the slave latch 110 of Pos-type F/F, and outputs the test data D1 to the data output terminal Q.

At time T15, since the scan clock signal SCLK is fallen, the slave latch 111 of Pos-type F/F holds the test data D1 from the slave latch 110 of Pos-type F/F.

Next, the capture operation will be described with reference to clock cycles C4 and C5. After time T30, since the scan mode control signal SMC is in the Low level, the normal clock signal is supplied to the master latch and the slave latch in any scan F/F.

At time T20, since the normal clock signal CLKB is raised, the master latch 210 of Neg-type F/F captures the capture data cap1 from the user circuit 1000. Further, at time T20, since the normal clock signal CLK is raised, the master latch 110 of Pos-type F/holds capture data capA from the user circuit 1001.

At time T21, since the normal clock signal CLKB is fallen, the slave latch 211 of Neg-type F/F captures output data cap1 from the master latch 210 of Neg-type F/F. Further, at time T21, since the normal clock signal CLKB is fallen, the master latch 210 of Neg-type F/F holds capture data cap1 from the user circuit 1000.

Further, at time T21, the master latch 110 of Pos-type F/F captures capture data capB from the user circuit 1001. Further, at time T21, the slave latch 111 of Pos-type F/F holds capture data capA from the master latch 110 of Pos-type F/F.

Next, at time T22, since the normal clock signal CLKB is raised, the master latch 210 of Neg-type F/F captures capture data cap2 from the user circuit 1000.

Further, at time T22, since the normal clock signal CLK is raised, the master latch 110 of Pos-type F/F holds capture data capB from the user circuit 1001. Further, at time T22, since the normal clock signal CLK is raised, the slave latch 111 of Pos-type F/F captures capture data capB from the master latch 110 of Pos-type F/F.

At time T23, since the normal clock signal CLKB is fallen, the slave latch 211 of Neg-type F/F captures output data cap2 from the master latch 210 of Neg-type F/F. Further, at time T23, since the normal clock signal CLKB is fallen, the master latch 210 of Neg-type F/F holds capture data cap2 from the user circuit 1000.

Further, at time T23, the slave latch 111 of Pos-type F/F holds capture data capB from the master latch 210 of Pos-type F/F.

The second embodiment achieves the similar effect as that in the first embodiment. In summary, it is possible to perform the correct shift operation and to perform the transition delay failure test, and there is no need to invert clock signals unlike the related arts. Accordingly, the delay failure test can be performed in the actual operating frequency. Further, only two latches of the master latch circuit 110 and the slave latch circuit 111 are required, which makes it possible to reduce the gate size. Further, in the second embodiment, since the number of clock signals is reduced from three to two, the layout area can further be reduced.

The first and second embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:
1. A flip-flop circuit comprising:
a master latch that selectively receives a data signal or a scan data signal; and
a slave latch that receives an output signal of the master latch, wherein one of the master latch and the slave latch is a high-level latch, and another one of the master latch and the slave latch is a low-level latch, the high-level latch being a circuit that captures a signal in a high level of a clock signal and holds data of the signal in a low level, the low-level latch being a circuit that captures a signal in a low level of a clock signal and holds data of the signal in a high level, wherein in a scan shift operation, the master latch captures the scan data signal in response to a first clock signal and the slave latch captures the output data signal in response to a second clock signal different from the first clock signal, wherein in another operation, the master latch captures the data signal in response to a normal clock signal and the slave latch captures the output data signal in response to the normal clock signal, and wherein the second clock signal is in a low level when the first clock signal is in a low level, and the first clock signal is in a high level when the second clock signal is in a high level.

2. The flip-flop circuit according to claim 1, wherein the flip-flop circuit captures the scan data signal in response to the first clock signal to output the scan data signal in response to the second clock signal in the scan shift operation when the flip-flop circuit constituted of a Positive-type scan flip-flop that operates in synchronization with the rising edge of the clock signal is used, and the flip-flop circuit captures the scan data signal in response to the second clock signal to output the scan data signal in response to the first clock signal in the scan shift operation when the scan flip-flop circuit constituted of a Negative-type scan flip-flop that operates in synchronization with the falling edge of the clock signal is used.

3. The flip-flop circuit according to claim 1, wherein the first clock signal is the normal clock signal, and the second clock signal is a scan clock signal and has a different edge position from the first clock signal.

4. The flip-flop circuit according to claim 3, further comprising:

a first selector that selects one of the data signal and the scan data signal depending on a scan mode signal to output the selected data to the master latch; and a fourth selector that selects one of the normal clock signal and the scan clock signal depending on the scan mode signal to output the selected signal to the slave latch.

5. The flip-flop circuit according to claim 1, wherein the first clock signal and the second clock signal are a first scan clock signal and a second scan clock signal that are different from the normal clock signal.

6. The flip-flop circuit according to claim 5, further comprising:

a first selector that selects one of the data signal and the scan data signal depending on a scan mode signal to output the selected data to the master latch;

a fifth selector that selects one of the normal clock signal and the first scan clock signal depending on the scan mode signal to output the selected signal to the master latch; and a sixth selector that selects one of the normal clock signal and the second scan clock signal depending on the scan mode signal to output the selected signal to the slave latch.

7. The flip-flop circuit according to claim 1, wherein a rising edge of the first clock signal is located before a rising edge of the second clock signal, and a falling edge of the first clock signal is located after a falling edge of the second clock signal.

8. The flip-flop circuit according to claim 1, wherein a falling edge of the second clock signal is located before a falling edge of the first clock signal, and a rising edge of the second clock signal is located after a rising edge of the first clock signal.

9. The flip-flop circuit according to claim 1, further comprising:

a first selector that selects one of the data signal and the scan data signal depending on a scan mode signal to output the selected data to the master latch;

a second selector that selects one of the first clock signal and the normal clock signal depending on the scan mode signal to output the selected signal to the master latch; and a third selector that selects one of the second clock signal and the normal clock signal depending on the scan mode signal to output the selected signal to the slave latch.

* * * * *